United States Patent
Pandya et al.

(10) Patent No.: US 9,117,530 B2
(45) Date of Patent: Aug. 25, 2015

(54) PRESERVING DATA FROM ADJACENT WORD LINES WHILE PROGRAMMING BINARY NON-VOLATILE STORAGE ELEMENTS

(71) Applicant: SANDISK TECHNOLOGIES INC., Plano, TX (US)

(72) Inventors: Tosha Pandya, San Jose, CA (US); Mrinal Kochar, San Jose, CA (US); Yee Koh, Fremont, CA (US)

(73) Assignee: SANDISK TECHNOLOGIES INC., Plano, TX (US)

( * ) Notice: Subject to any disclaimer, the term of this patent is extended or adjusted under 35 U.S.C. 154(b) by 323 days.

(21) Appl. No.: 13/831,420

(22) Filed: Mar. 14, 2013

(65) Prior Publication Data

US 2014/0269071 A1    Sep. 18, 2014

(51) Int. Cl.
| | | |
|---|---|---|
| *G11C 11/34* | (2006.01) | |
| *G11C 16/10* | (2006.01) | |
| *G11C 16/04* | (2006.01) | |
| *G11C 16/06* | (2006.01) | |
| *G11C 16/34* | (2006.01) | |
| *G11C 29/00* | (2006.01) | |
| *G11C 11/56* | (2006.01) | |

(52) U.S. Cl.
CPC ............ *G11C 16/10* (2013.01); *G11C 16/0483* (2013.01); *G11C 16/06* (2013.01); *G11C 16/3427* (2013.01); *G11C 29/82* (2013.01); *G11C 11/5642* (2013.01)

(58) Field of Classification Search
USPC ............. 365/185.03, 185.09, 185.12, 185.17, 365/185.18, 185.19, 185.21, 185.22, 365/185.24, 185.29, 185.33
See application file for complete search history.

(56) References Cited

U.S. PATENT DOCUMENTS

| | | | |
|---|---|---|---|
| 5,930,167 A | 7/1999 | Lee | |
| 5,936,884 A | 8/1999 | Hasbun | |
| 6,717,847 B2 | 4/2004 | Chen | |
| 7,196,928 B2 | 3/2007 | Chen | |
| 7,251,717 B2 | 7/2007 | Nishikawa | |
| 7,310,347 B2 | 12/2007 | Lasser | |
| 7,315,477 B2 * | 1/2008 | Chen ..................... | 365/185.17 |
| 7,388,781 B2 | 6/2008 | Litsyn | |
| 7,440,319 B2 | 10/2008 | Li | |
| 7,489,554 B2 * | 2/2009 | Nguyen et al. ........... | 365/185.17 |
| 7,532,516 B2 * | 5/2009 | Nguyen et al. ........... | 365/185.17 |
| 7,570,520 B2 | 8/2009 | Kamei | |
| 7,606,076 B2 * | 10/2009 | Nguyen et al. ........... | 365/185.17 |
| 7,606,084 B2 * | 10/2009 | Kamei ..................... | 365/185.17 |
| 7,616,506 B2 * | 11/2009 | Mui et al. ................. | 365/185.17 |
| 7,885,119 B2 | 2/2011 | Li | |

(Continued)

FOREIGN PATENT DOCUMENTS

EP    2200045    6/2010

OTHER PUBLICATIONS

U.S. Appl. No. 13/668,160, filed Nov. 2, 2012.

(Continued)

*Primary Examiner* — Trong Phan
(74) *Attorney, Agent, or Firm* — Vierra Magen Marcus LLP

(57) ABSTRACT

A system and methods for programming non-volatile memory elements by using latches to transfer data. Upon discovering errors in previously programmed non-volatile memory elements, the system recovers the corresponding data from the latches and programming the recovered data to other non-volatile memory elements.

20 Claims, 20 Drawing Sheets

(56) References Cited

U.S. PATENT DOCUMENTS

| | | |
|---|---|---|
| 8,111,548 B2 | 2/2012 | Mokhlesi |
| 8,223,554 B2 * | 7/2012 | Hemink .................. 365/185.17 |
| 8,369,149 B2 * | 2/2013 | Dutta et al. .............. 365/185.17 |
| 8,395,936 B2 * | 3/2013 | Li et al. .................... 365/185.17 |
| 8,902,659 B2 * | 12/2014 | Chan ........................ 365/185.17 |
| 8,988,942 B2 * | 3/2015 | Sharon ..................... 365/185.17 |
| 2006/0291303 A1 | 12/2006 | Kleveland |
| 2007/0121378 A1 | 5/2007 | Shibata |
| 2007/0180346 A1 | 8/2007 | Murin |
| 2008/0074928 A1 | 3/2008 | Choi |
| 2008/0123412 A1 | 5/2008 | Lasser |
| 2008/0259684 A1 | 10/2008 | Shlick |
| 2008/0266948 A1 | 10/2008 | Jang |
| 2009/0089481 A1 | 4/2009 | Kapoor |
| 2011/0145668 A1 | 6/2011 | Kim |
| 2012/0236670 A1 | 9/2012 | Hemink |
| 2012/0314502 A1 | 12/2012 | Mokhlesi |

OTHER PUBLICATIONS

U.S. Appl. No. 13/749,956, filed Jan. 25, 2013.
U.S. Appl. No. 13/749,968, filed Jan. 25, 2013.

* cited by examiner

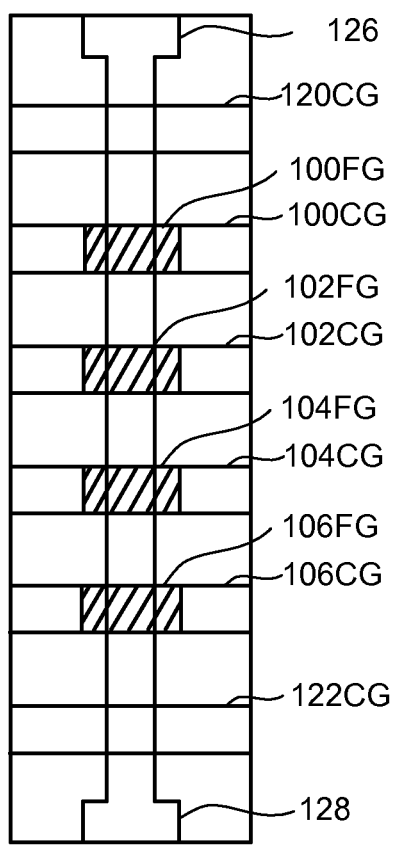
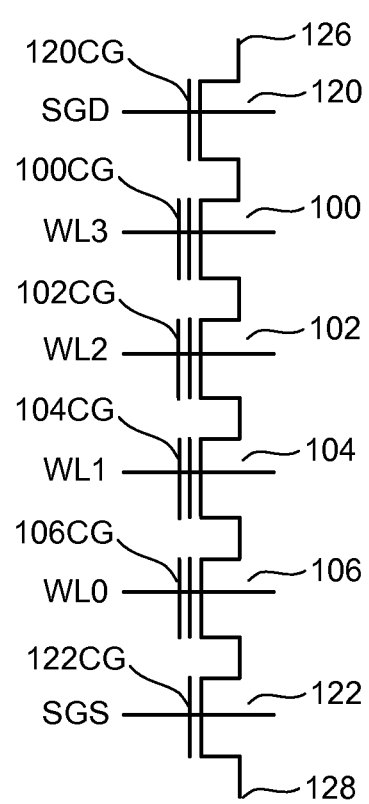
Fig. 1
Fig. 2

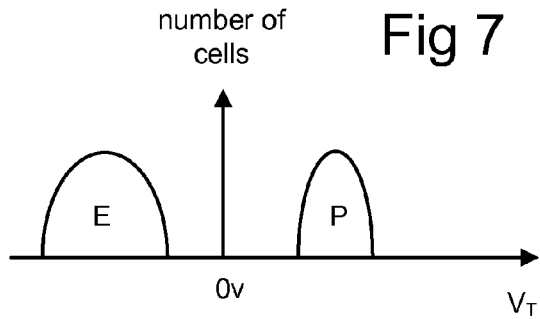
Fig 7
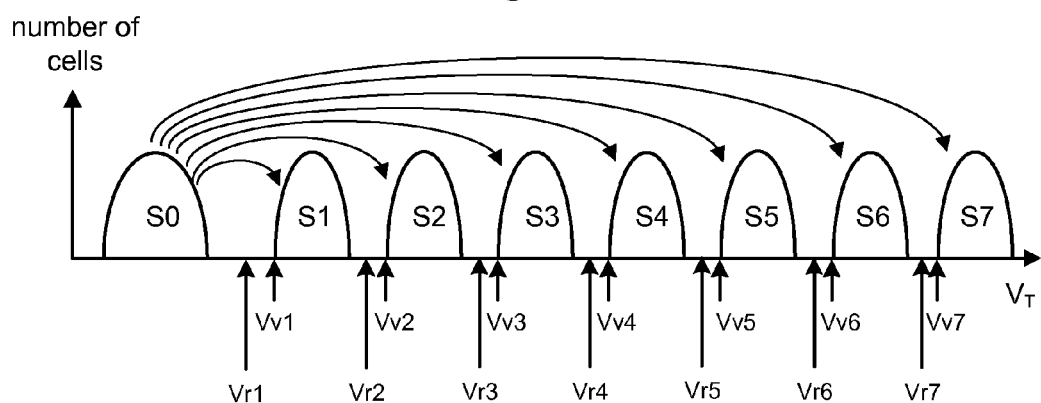
Fig 7A
Fig 8
|  | First Page | Second Page | Third Page |
|---|---|---|---|
| WL0 | 1 | 3 | 6 |
| WL1 | 2 | 5 | 9 |
| WL2 | 4 | 8 | 11 |
| WL3 | 7 | 10 | 12 |

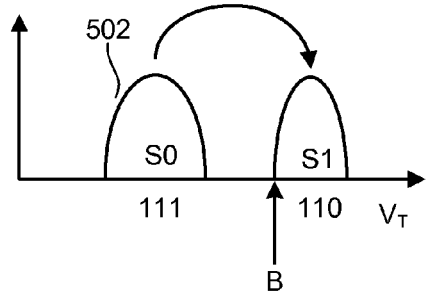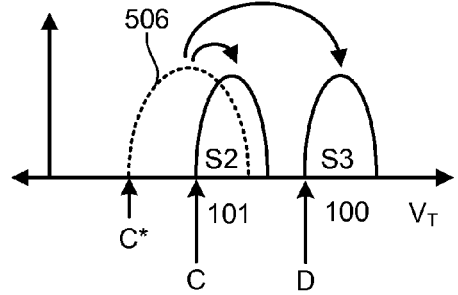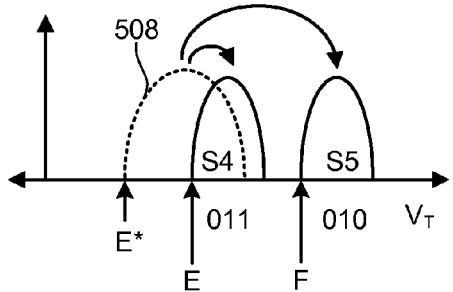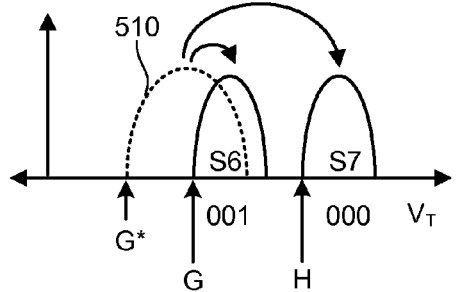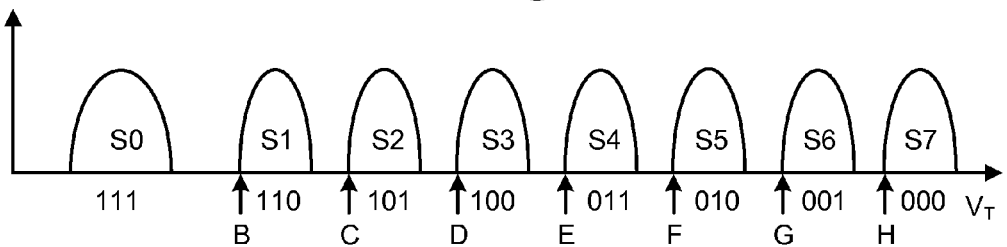

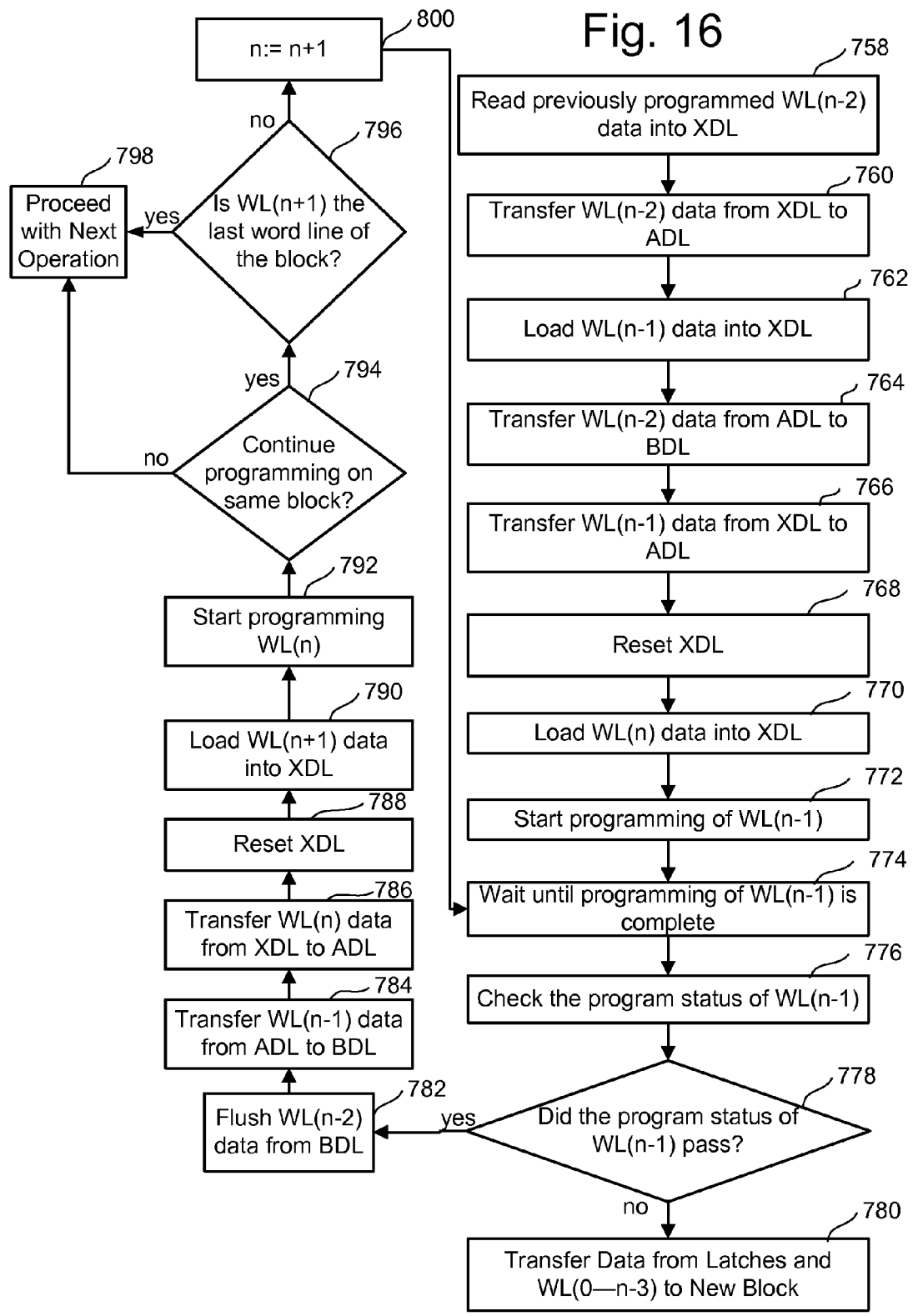

PRESERVING DATA FROM ADJACENT WORD LINES WHILE PROGRAMMING BINARY NON-VOLATILE STORAGE ELEMENTS

BACKGROUND

1. Field

The present invention relates to technology for non-volatile storage.

2. Description of the Related Art

Semiconductor memory has become more popular for use in various electronic devices. For example, non-volatile semiconductor memory is used in cellular telephones, digital cameras, personal digital assistants, mobile computing devices, non-mobile computing devices and other devices. Electrical Erasable Programmable Read Only Memory (EEPROM) and flash memory are among the most popular non-volatile semiconductor memories.

Some EEPROM and flash memory utilize a floating gate that is positioned above and insulated from a channel region in a semiconductor substrate. The floating gate is positioned between the source and drain regions. A control gate is provided over and insulated from the floating gate. The threshold voltage of the transistor is controlled by the amount of charge that is retained on the floating gate. That is, the minimum amount of voltage that must be applied to the control gate before the transistor is turned on to permit conduction between its source and drain is controlled by the level of charge on the floating gate. Thus, a memory cell (which can include one or more transistors) can be programmed and/or erased by changing the level of charge on a floating gate in order to change the threshold voltage.

When programming an EEPROM or flash memory device, such as a NAND flash memory device, typically a program voltage is applied to the control gate and the bit line is grounded. Electrons from the channel are injected into the floating gate. When electrons accumulate in the floating gate, the floating gate becomes negatively charged and the threshold voltage of the memory cell is raised so that the memory cell is in a programmed state. More information about programming can be found in U.S. Pat. No. 6,859,397, titled "Source Side Self Boosting Technique For Non-Volatile Memory," and in U.S. Patent Application Publication 2005/0024939, titled "Detecting Over Programmed Memory," both of which are incorporated herein by reference in their entirety. In many devices, the program voltage applied to the control gate during a program operation is applied as a series of pulses in which the magnitude of the pulses is increased by a predetermined step size for each successive pulse.

Each memory cell can store data (analog or digital). When storing one bit of digital data (referred to as a binary data), possible threshold voltages of the memory cell are divided into two ranges which are assigned logical data "1" and "0." In one example, the threshold voltage is negative after the memory cell is erased, and defined as logic "1." After programming, the threshold voltage is positive and defined as logic "0." When the threshold voltage is negative and a read is attempted by applying 0 volts to the control gate, the memory cell will turn on to indicate logic one is being stored. When the threshold voltage is positive and a read operation is attempted by applying 0 volts to the control gate, the memory cell will not turn on, which indicates that logic zero is stored.

A memory cell can also store multiple levels of information (referred to as multi-state data). In the case of multi-state data, the range of possible threshold voltages is divided into the number of levels of data. For example, if four levels of information are stored, there will be four threshold voltage ranges assigned to the data values "11", "10", "01", and "00." In one example, the threshold voltage after an erase operation is negative and defined as "11." Positive threshold voltages are used for the states of "10", "01", and "00." If eight levels of information (or states) are stored in each memory cell (e.g. for three bits of data per memory cell), there will be eight threshold voltage ranges assigned to the data values "000", "001", "010", "011" "100", "101", "110" and "111." The specific relationship between the data programmed into the memory cell and the threshold voltage levels of the memory cell depends upon the data encoding scheme adopted for the memory cells. For example, U.S. Pat. No. 6,222,762 and U.S. Patent Application Publication No. 2004/0255090, both of which are incorporated herein by reference in their entirety, describe various data encoding schemes for multi-state memory cells. In one embodiment, data values are assigned to the threshold voltage ranges using a Gray code assignment so that if the threshold voltage of a floating gate erroneously shifts to its neighboring physical state, only one bit will be affected. In some embodiments, the data encoding scheme can be changed for different word lines, the data encoding scheme can be changed over time, or the data bits for random word lines may be inverted to reduce data pattern sensitivity and even wearing.

Memory cells storing multi-state data can store more data than memory ells storing binary data; therefore, the cost per bit is smaller. However, memory cells storing multi-state data program slower than memory cells storing binary data because memory cells storing multi-state data program to multiple target threshold voltage ranges and require a higher level of precision during programming. For these reasons, some commercial memory systems employ memory die whose memory arrays exclusively comprise memory cells storing binary data. Other technologies employ memory die that store data primarily in memory cells storing multi-state data. Some memory systems first program data to a cache of memory cells storing binary data in order to take advantage of the speed of programming these memory cells. Then, while the memory system is idle or busy with other operations, the cache of memory cells storing binary data transfers the stored data to memory cells storing multi-state data in order to take advantage of the greater capacity. For example, U.S. Pat. No. 8,111,548, incorporated herein by reference in its entirety, describes a method for transferring data from memory cells storing binary data to memory cells storing multi-state data.

In order to store more data, the size of memory cells continues to shrink. However, scaling the sizes of memory cells entails certain risks. In order to achieve the advantage of higher memory capacity for a fixed die size, these smaller memory cells must be packed more closely together. Doing so, however, may result in a greater number of manufacturing errors, such as shorting between the word lines. Such errors usually corrupt any data stored on pages on the word lines being programmed and neighboring word lines.

BRIEF DESCRIPTION OF THE DRAWINGS

FIG. 1 is a top view of a NAND string.

FIG. 2 is an equivalent circuit diagram of the NAND string.

FIG. 7 is a block diagram depicting one embodiment of a controller.

FIG. 7A depicts an example set of threshold voltage distributions and describes a process for programming non-volatile memory.

FIG. 8 is a table depicting one example of an order of programming non-volatile memory.

FIGS. 9A-I show various threshold voltage distributions and describe a process for programming non-volatile memory.

FIG. 16 depicts a flow chart describing one embodiment of a process for programming binary data into blocks.

DETAILED DESCRIPTION

Figure 3:
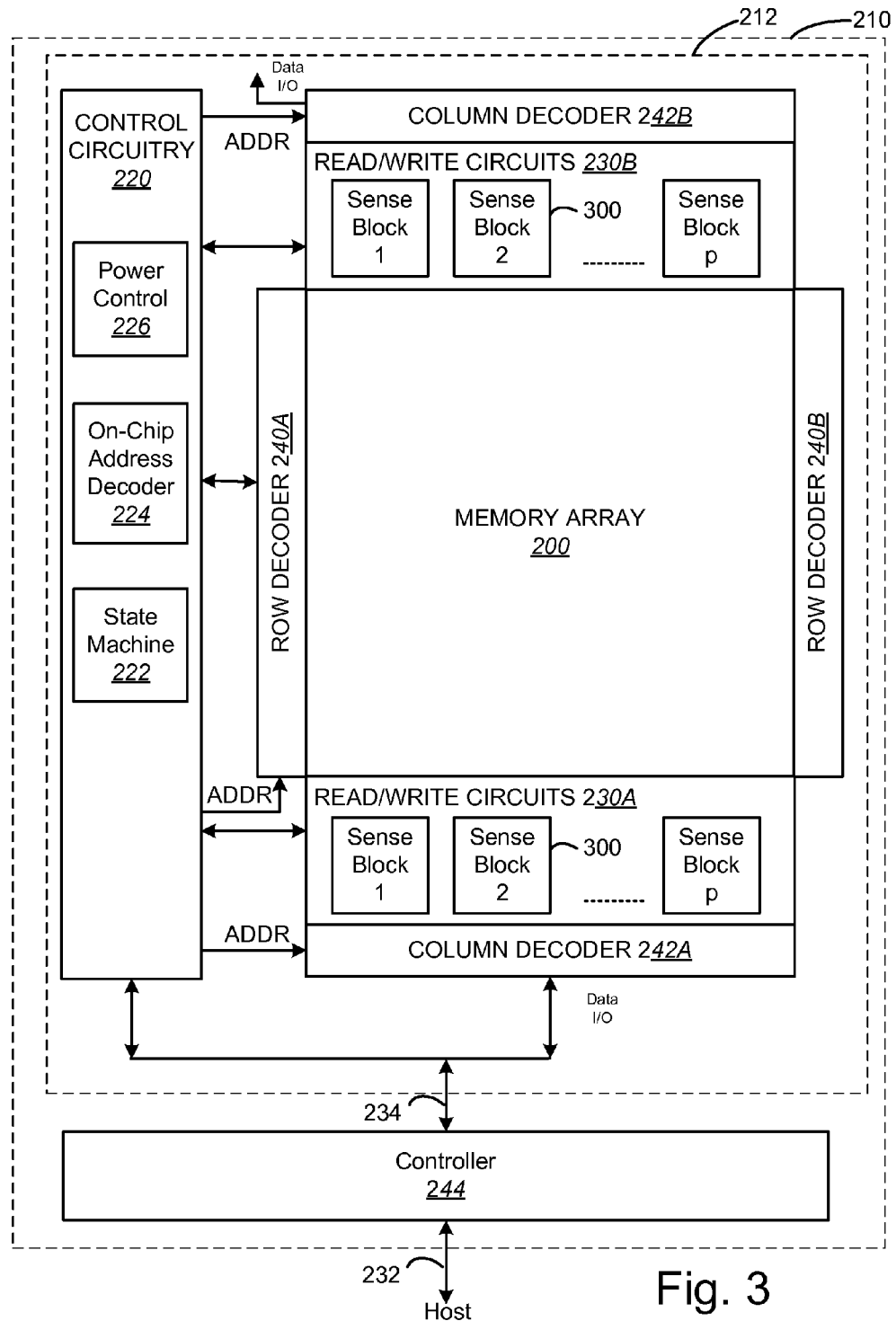
FIG. 3 is a block diagram of a non-volatile memory system.

Memory die can store data in memory cells storing binary data. This storage can either be permanent (until erasure), or temporary (i.e. as a cache) until the data is transferred to memory cells storing multi-state data. Whether memory cells storing binary data are used as storage or as cache, sometimes errors can occur in which data saved in the memory cells is corrupted due to physical faults such as shorts between word lines. Described below is a system and methods for using latches to preserve data that has been programmed into memory cells such that, if an error is discovered, the preserved data can be safely re-programmed to a new location. Some embodiments of the disclosed technology can be employed in a flash memory system that programs data to memory cells storing binary data, and, in some cases, memory cells storing multi-state data.

One example of a flash memory system uses the NAND structure, which includes arranging multiple transistors in series, sandwiched between two select gates. The transistors in series and the select gates are referred to as a NAND string. FIG. 1 is a top view showing one NAND string. FIG. 2 is an equivalent circuit thereof. The NAND string depicted in FIGS. 1 and 2 includes four transistors 100, 102, 104 and 106 in series and sandwiched between a first (or drain side) select gate 120 and a second (or source side) select gate 122. Select gate 120 connects the NAND string to a bit line via bit line contact 126. Select gate 122 connects the NAND string to source line 128. Select gate 120 is controlled by applying the appropriate voltages to select line SGD. Select gate 122 is controlled by applying the appropriate voltages to select line SGS. Each of the transistors 100, 102, 104 and 106 has a control gate and a floating gate. For example, transistor 100 has control gate 100CG and floating gate 100FG. Transistor 102 includes control gate 102CG and a floating gate 102FG. Transistor 104 includes control gate 104CG and floating gate 104FG. Transistor 106 includes a control gate 106CG and a floating gate 106FG. Control gate 100CG is connected to word line WL3, control gate 102CG is connected to word line WL2, control gate 104CG is connected to word line WL1, and control gate 106CG is connected to word line WL0.

Note that although FIGS. 1 and 2 show four memory cells in the NAND string, the use of four memory cells is only provided as an example. A NAND string can have less than four memory cells or more than four memory cells. For example, some NAND strings will include eight memory cells, 16 memory cells, 32 memory cells, 64 memory cells, 128 memory cells, etc. The discussion herein is not limited to any particular number of memory cells in a NAND string.

A typical architecture for a flash memory system using a NAND structure will include several NAND strings. Each NAND string is connected to the source line by its source select gate controlled by select line SGS and connected to its associated bit line by its drain select gate controlled by select line SGD. Each bit line and the respective NAND string(s) that are connected to that bit line via a bit line contact comprise the columns of the array of memory cells. Bit lines are shared with multiple NAND strings. Typically, the bit line runs on top of the NAND strings in a direction perpendicular to the word lines and is connected to one or more sense amplifiers.

Relevant examples of NAND type flash memories and their operation are provided in the following U.S. Patents/Patent Applications, all of which are incorporated herein by reference: U.S. Pat. No. 5,570,315; U.S. Pat. No. 5,774,397; U.S. Pat. No. 6,046,935; U.S. Pat. No. 6,456,528; and U.S. Pat. Publication No. US2003/0002348.

Other types of non-volatile storage devices can also be used, including memory cells that do not use floating gates. For example, nonvolatile memory devices are also manufactured from memory cells that use a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric. Other types of non-volatile storage can also be used.

FIG. 3 illustrates a memory device 210 having read/write circuits for reading and programming memory cells (e.g., NAND multi-state flash memory or other type of non-volatile memory) in parallel. Memory device 210 may include one or more memory die or chips 212. Memory die 212 includes an array (two-dimensional or three dimensional) of memory cells 200, control circuitry 220, and read/write circuits 230A and 230B. In one embodiment, access to the memory array 200 by the various peripheral circuits is implemented in a symmetric fashion, on opposite sides of the array, so that the densities of access lines and circuitry on each side are reduced by half. The read/write circuits 230A and 230B include multiple sense blocks 300 (Sense Block 1, Sense Block 2, . . . Sense Block P) which allow a page (or other unit) of memory cells to be read or programmed in parallel. The memory array 200 is addressable by word lines via row decoders 240A and 240B and by bit lines via column decoders 242A and 242B. Word lines and bit lines are examples of control lines. In a typical embodiment, a controller 244 is included in the same memory device 210 (e.g., a removable storage card or package) as the one or more memory die 212. Commands and data are transferred between the host and controller 244 via lines 232 and between the controller and the one or more memory die 212 via lines 234 (Data I/O).

Control circuitry 220 cooperates with the read/write circuits 230A and 230B to perform memory operations on the memory array 200. The control circuitry 220 includes a state machine 222, an on-chip address decoder 224 and a power control module 226. The state machine 222 provides chip-level control of memory operations. The on-chip address decoder 224 provides an address interface between that used by the host or a memory controller to the hardware address ADDR used by the decoders 240A, 240B, 242A, and 242B. The power control module 226 controls the power and voltages supplied to the word lines and bit lines during memory operations. In one embodiment, power control module 226 includes one or more charge pumps that can create voltages larger than the supply voltage.

In one embodiment, one or any combination of control circuitry 220, power control circuit 226, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing or control circuits. The one or more managing or control circuits perform the processes described herein.

Figure 4:
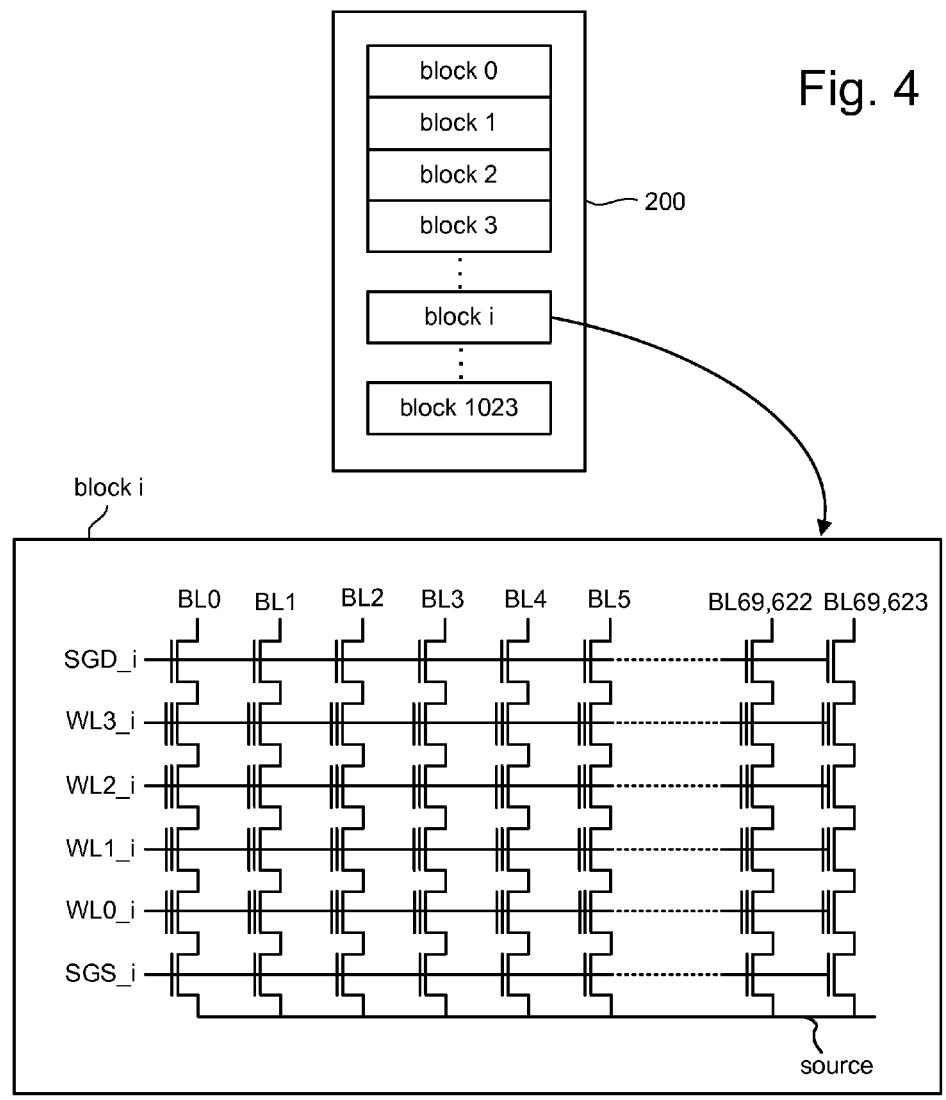
FIG. 4 is a block diagram depicting one embodiment of a memory array.

FIG. 4 depicts an exemplary structure of memory cell array 200. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND stings which are accessed via bit lines (e.g., bit lines BL0-BL69, 623) and word lines (WL0_i, WL1_i, WL2_i, WL3_i). FIG. 4 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD_i), and another terminal is connected to the source line via a source select gate (connected to select gate source line SGS_i).

Each block is typically divided into a number of pages. In one embodiment, a page is a unit of programming. Other units of programming can also be used. One or more pages of data are typically stored in one row of memory cells. For example, one or more pages of data may be stored in memory cells connected to a common word line. A page can store one or more sectors. A sector includes user data and overhead data (also called system data). Overhead data typically includes header information and Error Correction Codes (ECC) that have been calculated from the user data of the sector. The controller (or other component) calculates the ECC when data is being programmed into the array, and also checks it when data is being read from the array. Alternatively, the ECCs and/or other overhead data are stored in different pages, or even different blocks, than the user data to which they pertain. A sector of user data is typically 512 bytes, corresponding to the size of a sector in magnetic disk drives. A large number of pages form a block, anywhere from 8 pages, for example, up to 32, 64, 128 or more pages. Different sized blocks, pages and sectors can also be used.

Figure 5:
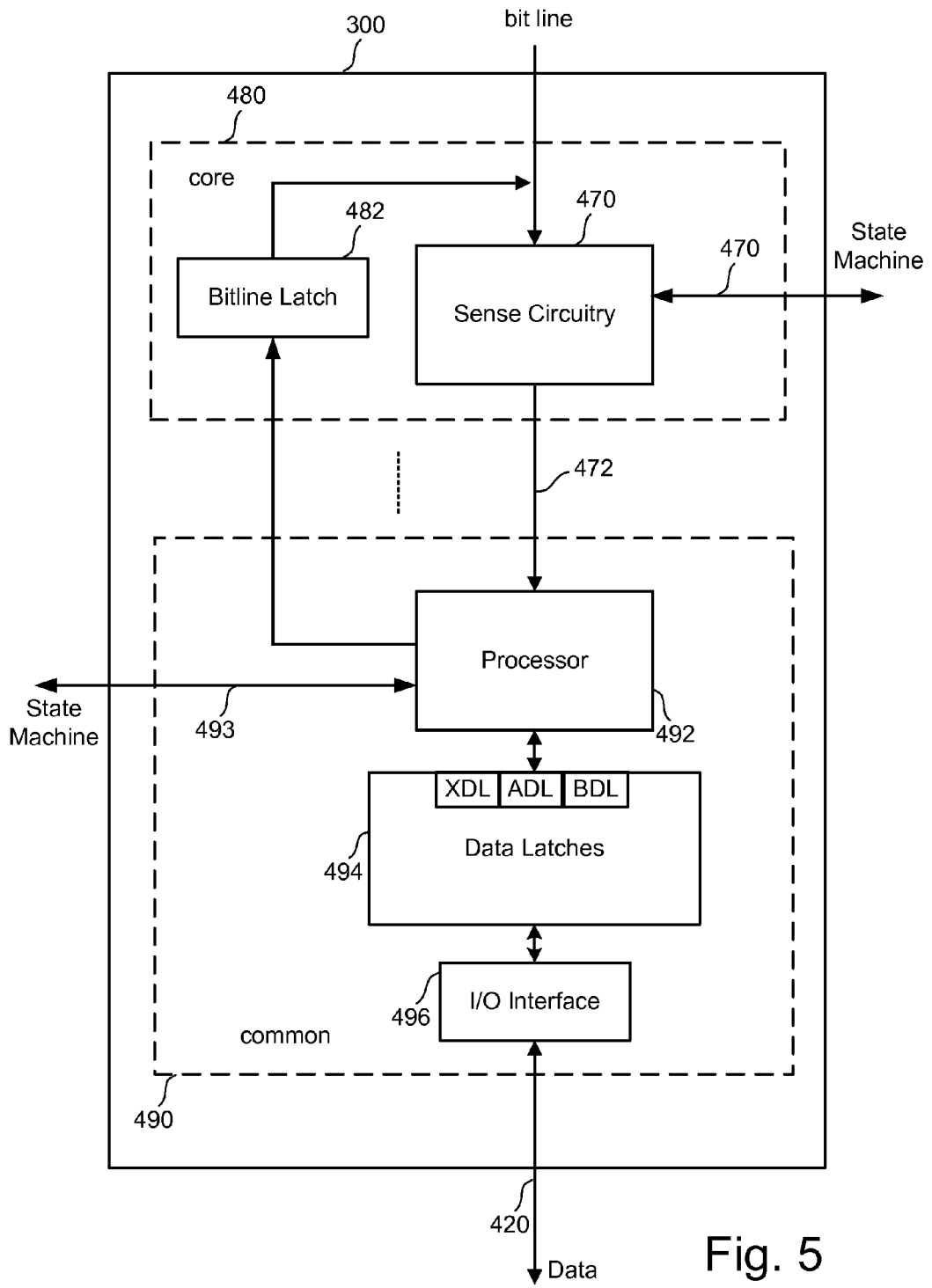
FIG. 5 is a block diagram depicting one embodiment of a sense block.

FIG. 5 is a block diagram of an individual sense block 300 partitioned into a core portion, referred to as a sense module 480, and a common portion 490. In one embodiment, there will be a separate sense module 480 for each bit line and one common portion 490 for a set of multiple sense modules 480. In one example, a sense block will include one common portion 490 and eight sense modules 480. Each of the sense modules in a group will communicate with the associated common portion via a data bus 472. One example can be found in U.S. Patent Application Publication 2006/0140007, which is incorporated herein by reference in its entirety.

Sense module 480 comprises sense circuitry 470 that determines whether a conduction current in a connected bit line is above or below a predetermined level. In some embodiments, sense module 480 includes a circuit commonly referred to as a sense amplifier. Sense module 480 also includes a bit line latch 482 that is used to set a voltage condition on the connected bit line. For example, a predetermined state latched in bit line latch 482 will result in the connected bit line being pulled to a state designating program inhibit (e.g., Vdd).

Common portion 490 comprises a processor 492, a set of data latches 494 and an I/O Interface 496 coupled between the set of data latches 494 and data bus 420. Processor 492 performs computations. For example, one of its functions is to determine the data stored in the sensed memory cell and store the determined data in the set of data latches. The set of data latches 494 is used to store data bits determined by processor 492 during a read operation. It is also used to store data bits imported from the data bus 420 during a program operation. The imported data bits represent write data meant to be programmed into the memory. I/O interface 496 provides an interface between data latches 494 and the data bus 420.

During read or sensing, the operation of the system is under the control of state machine 222 that controls (using power control 226) the supply of different control gate voltages to the addressed memory cell(s). As it steps through the various predefined control gate voltages corresponding to the various memory states supported by the memory, the sense module 480 may trip at one of these voltages and an output will be provided from sense module 480 to processor 492 via bus 472. At that point, processor 492 determines the resultant memory state by consideration of the tripping event(s) of the sense module and the information about the applied control gate voltage from the state machine via input lines 493. It then computes a binary encoding for the memory state and stores the resultant data bits into data latches 494. In another embodiment of the core portion, bit line latch 482 serves double duty, both as a latch for latching the output of the sense module 480 and also as a bit line latch as described above.

It is anticipated that some implementations will include multiple processors 492. In one embodiment, each processor 492 will include an output line (not depicted in FIG. 5) such that each of the output lines is wired-OR'd together. In some embodiments, the output lines are inverted prior to being connected to the wired-OR line. This configuration enables a quick determination during the program verification process of when the programming process has completed because the state machine receiving the wired-OR line can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. In embodiments where each processor communicates with eight sense modules, the state machine may (in some embodiments) need to read the wired-OR line eight times, or logic is added to processor 492 to accumulate the results of the associated bit lines such that the state machine need only read the wired-OR line one time.

Data latch stack 494 contains a stack of data latches corresponding to the sense module. In one embodiment, there are three (or four or another number) data latches per sense module 480. In one embodiment, the latches are each one bit. Throughout this document, three latches in one embodiment of data latch stack 494 will be referred to as XDL, ADL, and BDL. Typically, data read from a memory cell or data to be programmed into a memory cell will first be stored in XDL. In case the data is to be programmed into a memory cell, the system can program the data into the memory cell from XDL. In one embodiment, the data is programmed into the memory cell entirely from XDL before the next operation proceeds. In an alternative embodiment (more details below), as the system begins to program a memory cell through XDL, the system also transfers the data stored in XDL into ADL in order to reset XDL. Before data is transferred from XDL into ADL, the data kept in ADL is transferred to BDL, flushing out whatever data (if any) is being kept in BDL. Once data has been transferred from XDL into ADL, the system continues (if necessary) to program the memory cell through ADL, while simultaneously loading the data to be programmed into a memory cell on the next word line into XDL, which has been reset. By performing the data load and programming operations simultaneously, the system can save time and thus perform a sequence of such operations faster. In some cases, data can be transferred directly from XDL to BDL, bypassing ADL. In some cases, data read from a memory cell can be stored directly into ADL, bypassing XDL.

As will be explained later, the XDL, ADL, and BDL latches can be used to preserve data in case a fault, such as a word line to word line short circuit, is discovered during the programming process. If such a fault is discovered, then the system can program the data stored in the latches in another block of memory cells. In one embodiment, the system programs the data stored in XDL, ADL (after transferring the data stored therein into XDL), and BDL (after transferring the data stored therein into XDL), in that order, into the new block of memory cells. The various methods involving XDL, ADL, and BDL, as described in FIGS. 14-19, may be performed at the instruction of state machine 222, controller 244, or other appropriately configured component. In some embodiments, the system has each of latches XDL, ADL, and BDL for each physical plane of the memory die.

During program or verify, the data to be programmed is stored in the set of data latches 494 from the data bus 420. During the verify process, Processor 492 monitors the verified memory state relative to the desired memory state. When the two are in agreement, processor 492 sets the bit line latch 482 so as to cause the bit line to be pulled to a state designating program inhibit. This inhibits the memory cell coupled to the bit line from further programming even if it is subjected to programming pulses on its control gate. In other embodiments the processor initially loads the bit line latch 482 and the sense circuitry sets it to an inhibit value during the verify process.

In some implementations (but not required), the data latches are implemented as a shift register so that the parallel data stored therein is converted to serial data for data bus 420, and vice versa. In one preferred embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

Additional information about the sensing operations and sense amplifiers can be found in (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; (4) U.S. Patent Publication 2006/0221692, titled "Compensating for Coupling During Read Operations of Non-Volatile Memory," Inventor Jian Chen, filed on Apr. 5, 2005; and (5) U.S. patent application Ser. No. 11/321,953, titled "Reference Sense Amplifier For Non-Volatile Memory, Inventors Siu Lung Chan and Raul-Adrian Cernea, filed on Dec. 28, 2005. All five of the immediately above-listed patent documents are incorporated herein by reference in their entirety.

At the end of a successful programming process (with verification), the threshold voltages of the memory cells should be within one or more distributions of threshold voltages for programmed memory cells or within a distribution of threshold voltages for erased memory cells, as appropriate.

Figure 6:
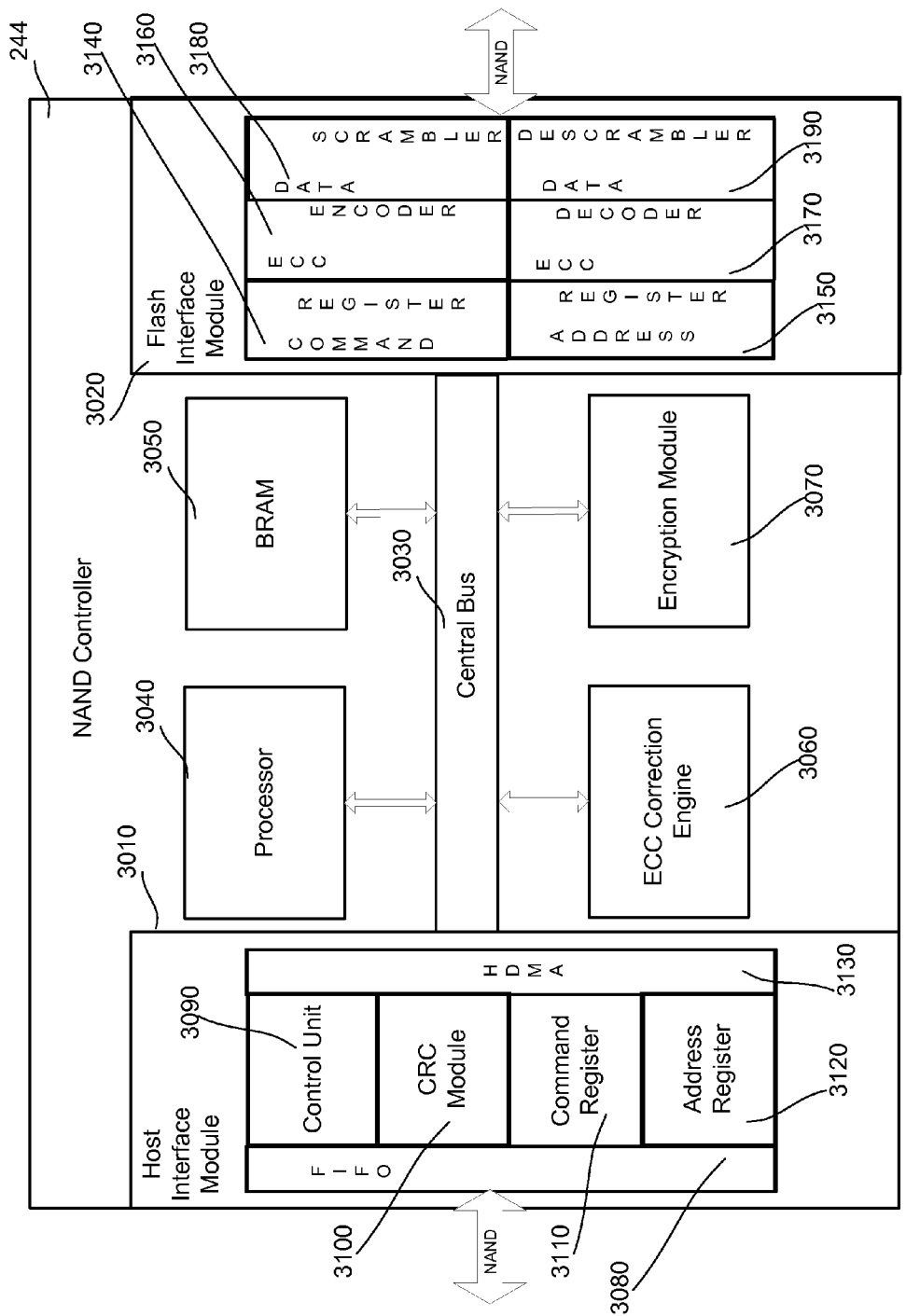
FIG. 6 depicts an example set of threshold voltage distributions and describes a process for programming non-volatile memory.

FIG. 6 is a diagram of one possible implementation of controller 244 of FIG. 3. It should be understood that any of the components shown in these drawings can be implemented as hardware, software/firmware, of a combination thereof. The Host Interface Module (HIM) 3010 is a collection of logic that supports the "host side interface" as a "flash device-type interface." The HIM 3010 comprises a first-in-first-out ("FIFO") module 3080, a control unit 3090, a cyclic redundancy check ("CRC") module 3100 (although another type of error detection code ("EDC") module can be used), a command register 3110, an address register 3120, and a host direct memory access ("HDMA") unit 3130. Some implementations of an HIM receive a high-level request from a host controller for a relatively large amount of data that spans several pages, and controller 244 determines what actions are needed to satisfy the request. Other embodiments of an HIM receive several smaller-sized requests (e.g. for individual pages) from a host controller, so the HIM is required to simultaneously handle multiple (e.g., eight) read and write requests.

Flash Interface Module (FIM) 3020 is implemented as a collection of logic and a low-level programmable sequencer that creates the "device side interface" as a "host-type interface." In this embodiment, the FIM 3020 comprises a command register 3140, an address register 3150, an ECC encoder module 3160, an ECC decoder module 3170, a data scrambler 3180, and a data descrambler 3190.

Internal to controller 244 is a processor 3040, which has local ROM, code RAM, and data RAM. The central bus 3030 connects the processor 3040, the HIM 3010, the FIM 3020, and the other module described below, and is used to transfer data between the different modules shown. This bi-directional bus 3030 may be either an electrical bus with actual connections to each internal component or an Advanced High-Speed Bus ("AHB") used in conjunction with an ARC microprocessor, which logically connects the various modules using an interconnect matrix. The central bus 3030 can transmit data, control signals, or both. Controller 244 also comprises a buffer RAM ("BRAM") 3050 that is used to temporarily store pages of data that are either being read or written, and an ECC correction engine 3060 for correcting errors. Controller 244 further comprises an encryption module 3070 for performing encryption/decryption functions.

Controller 244 can further comprise a column replacement module, which is implemented here by either the FIM sequencer, firmware in the processor 3040, or in a small amount of logic and a table located in the FIM 3020. The column replacement module allows flash memory device(s) to contain information on bad column locations. The bad column address information is contained in flash memory devices and is scanned by firmware prior to any read or write operation. After firmware scans the flash memory device(s), it builds a bad column address table with the bad column location to be used by the column replacement module. On flash write operations, the column replacement module inserts the data for the address that is detected in a bad column address table. On flash read operations, data from the bad column address will be discarded.

With the components of controller 244 now generally described, exemplary write and read operations of controller 244 will now be presented. Turning first to a write operation, the FIFO 3080 in the HIM 3010 acts as a buffer for an incoming write command, address, and data from a host controller and synchronizes those elements to the system card domain. The CRC module 3100 checks the incoming information to determine if any transmission errors are present. (The CRC module 3100 is an example of the EDC module discussed above.) The CRC module generates or checks an error detection code to check for transmission errors as part of an end-to-end data protection scheme. If no errors are detected, the control unit 3090 decodes the command received from the FIFO 3080 and stores it in the command register 3110, and also stores the address in the address register 3120. The data received from the host controller is sent through the HDMA AHB interface 3130 to the BRAM 3050 via the central bus 3030. The control unit 3090 sends an interrupt to the processor 3040, in response to which the processor 3040, in response to which the processor 3040 reads the command from the command register 3080 and the address register 3120 and, based on the command, sets up the data path in the FIM 3020 and stores the command in the FIM's command register 3140. The processor 3040 also translates the address from a NAND interface into an internal NAND address and stores it in the FIM's address register 3150. If logical-to-physical address conversion is to be performed, the processor 3040 can use a mapping table to create the correct physical address. The processor 3040 can also perform one or more additional functions described below. The processor 3040 then sets up a data transfer from the BRAM 3050 to the FIM 3020.

The FIM 3020 takes the value from the address register 3150 and formats it in accordance with the standard of the NAND interface with which FIM 3020 communicates. The data stored in BRAM 3050 is sent to the encryption module 3070 for encryption and is then sent through the data scrambler 3180. The data scrambler 3180 scrambles the data and outputs the data to the FIM's ECC encoder 3160, which generates the ECC parity bits to be stored with the data. The data and ECC bits are then transferred over the second NAND interface with the write command to the flash memory device(s) for storage. As an example of an additional function that may occur during writes, if protection for write aborts or program failures is enabled and if the write request is to an upper page address, the processor 3040 can send a read command to flash memory device(s) over the second NAND interface for the corresponding lower page and then send a program command to have it copied into a safe zone (a spare scratchpad area) by writing it back to another location in the flash memory devices. If an error occurs in writing the upper page, the lower page can still be read back from the safe zone and the error corrected.

Turning now to a read operation, HIM 3010 receives a read command from a host controller, and the processor 3040 reads the command and logical address. If logical-to-physical address conversion is to be performed, the firmware in the processor 3040 could use a mapping table to create the correct physical address. (This is an example of the address mapping module discussed above.) The firmware then sends the physical address over a second NAND interface to a flash memory device. After the read access, the data is transferred over the NAND interface, decoded and used to generate the syndrome data for error correction, descrambled by the data descrambler 3190, and then sent over the central bus 3030 to the BRAM 3050. The ECC correction engine 3060 is used to correct any errors that can be corrected using the ECC on the data that is stored in the BRAM 3050. Since the ECC may be computed and stored in portions of a physical page, the processor 3040 can be interrupted as each portion of the page is received or corrected, or once when all of the data is transferred. The encryption module 3070 then performs a decryption operation on the data. The timing described above is flexible since the first and second NAND interfaces may operate at different speeds, and the firmware can transfer the data using either store-and-forward techniques or speed-match buffering. When the data is sent back to the host controller it is sent through the HIM 3010, and the transmission CRC is sent back to the host over the first NAND interface to check for transmission error.

As mentioned above, in addition to handling commands sent from the host controller, the processor 3040 may perform one or more additional functions asynchronously or independent of any specific command sent by the host. For example, if the ECC correction engine 3060 can correct the soft error and also interrupt the processor 3040 to log the page location so that the corresponding block could be read scrubbed at a later point in time. Other exemplary background tasks that can be performed by the processor 3040 are wear leveling and mapping of bad blocks and spare blocks.

FIG. 7 (plotting $V_T$ versus number of cells, about an origin of 0 volts) illustrates example threshold voltage distributions (also called data states) for the memory cell array when each memory cell stores binary data. Two data states are depicted: state E and state P. State E corresponds to memory cells that are erased. State P corresponds to memory cells that are programmed. In one embodiment, state E corresponds to distribution of threshold voltages below 0 volts and state P corresponds to distribution of threshold voltages above 0 volts. In other embodiments, both states can be above zero volts or both can be below zero volts. In one example, memory cells of a block are erased. Those memory cells that are to store data "1" will remain erased in state E. Those memory cells that are to store data "0" will be programmed to state P. In other embodiments, state E can store "0" and state P can store "1."

FIG. 7A (plotting $V_T$ versus number of cells) illustrates example threshold voltage distributions (also called data states) for the memory cell array when each memory cell stores three bits of multi-state data. Other embodiment, however, may use more or less than three bits of data per memory cell (e.g., such as four or more bits of data per memory cell).

In the example of FIG. 7A, each memory cell stores three bits of data; therefore, there are eight valid data states S0-S7. In one embodiment, data state S0 is below 0 volts and data states S1-S7 are above 0 volts. In other embodiments, all eight data states are above 0 volts, or other arrangements can be implemented. In one embodiment, the threshold voltage distribution S0 is wider than distributions S1-S7.

Each data state corresponds to a unique value for the three bits stored in the memory cell. In one embodiment, S0=111, S1=110, S2=101, S3=100, S4=011, S5=010, S6=001 and S7=000. Other mapping of data to states S0-S7 can also be used. In one embodiment, all of the bits of data stored in a memory cell are stored in the same logical page. In other embodiments, each bit of data stored in a memory cell corresponds to different logical pages. Thus, a memory cell storing three bits of data would include data in a first page, data in a second page and data in a third page. In some embodiments, all of the memory cells connected to the same word line would store data in the same three pages of data. In some embodiments, the memory cells connected to a word line can be grouped into different sets of pages (e.g., by odd and even bit lines, or by other arrangements).

In some prior art devices, the memory cells will be erased to state S0. From state S0, the memory cells can be programmed to any of states S1-S7. In one embodiment, known as full sequence programming, memory cells can be programmed from the erased state S0 directly to any of the programmed states S1-S7. For example, a population of memory cells to be programmed may first be erased so that all memory cells in the population are in erased state S0. While some memory cells are being programmed from state S0 to state S1, other memory cells are being programmed from state S0 to state S2, state S0 to state S3, state S0 to state S4, state S0 to state S5, state S0 to state S6, and state S0 to state S7. Full sequence programming is graphically depicted by the seven curved arrows of FIG. 7A FIG. 7A shows a set of target verify levels Vv1, Vv2, Vv3, Vv4, Vv5, Vv6, and Vv7. These target verify levels are used as comparison levels during the programming process. For example, when programming memory cells to state 1, the system will check to see if the threshold voltages of the memory cells has reached Vv1. If the threshold voltage of a memory cell has not reached Vv1, then programming will continue for that memory cell until its threshold voltage is greater than or equal to Vv1. If the threshold voltage of a memory cell has reached Vv1, then programming will stop for that memory cell. Target verify level Vv2 is used for memory cells being programmed to state 2. Target verify level Vv3 is used for memory cells being programmed to state 3. Target verify level Vv4 is used for memory cells being programmed to state 4. Target verify level Vv5 is used for memory cells being programmed to state 5. Target verify level Vv6 is used for memory cells being programmed to state 6. Target verify level Vv7 is used for memory cells being programmed to state 6.

FIG. 7A also shows a set of read compare levels Vr1, Vr2, Vr3, Vr4, Vr5, Vr6, and Vr7. These read compare levels are used as comparison levels during the read process. By testing whether the memory cells turn on or remain off in response to the read compare levels Vr1, Vr2, Vr3, Vr4, Vr5, Vr6, and Vr7 being separately applied to the control gates of the memory cells, the system can determine which states that memory cells are in.

FIGS. 9A-9I (which plot $V_T$ versus number of cells) disclose another process for programming multi-state data. Prior to the first step, the memory cells will be erased so that they are in the erase threshold distribution of state S0. The process of FIGS. 9A-9I assumes that each memory cell stores three bits of data, with each bit being in a different page. The first bit of data (the leftmost bit) is associated with the first page. The middle bit is associated with the second page. The rightmost bit is associated with the third page. In one embodiment, the correlation of data states to data is as follows: S0=111, S1=110, S2=101, S3=100, S4=011, S5=010, S6=001 and S7=000. However, other embodiments can use other data encoding schemes.

Figure 9A:
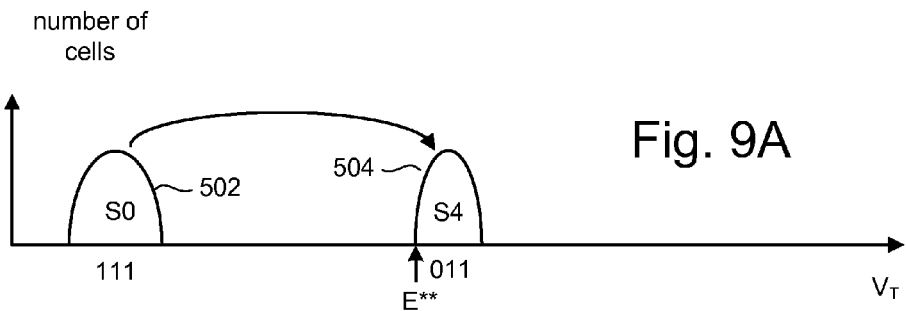
Figure 9B:
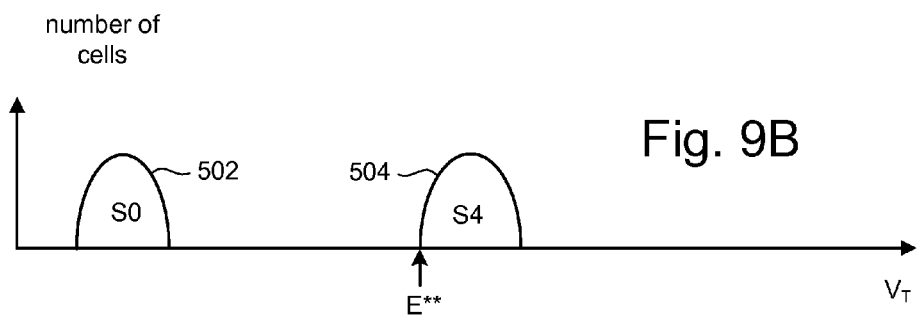

When programming the first page (as described in FIG. 9A), if the bit is to be data "1" then the memory cell will stay in state S0 (threshold voltage distribution 502). If the bit is to be data "0" then the memory cell is programmed to state S4 (threshold voltage distribution 504). After adjacent memory cells are programmed, capacitive coupling between adjacent floating gates may cause the state S4 to widen as depicted in FIG. 9B. State S0 may also widen, but there is sufficient margin between S0 and S1 to ignore the effect. More information about capacitive coupling between adjacent floating gates can be found in U.S. Pat. No. 5,867,429 and U.S. Pat. No. 6,657,891, both of which are incorporated herein by reference in their entirety.

Figure 9C:
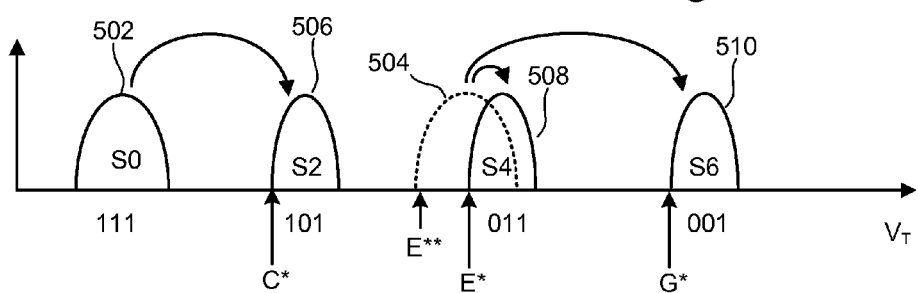

When programming the second page (see FIG. 9C), if the memory cell is in state S0 and the second page bit is data "1" then the memory cell stays in state S0. In some embodiments, the programming process for the second page will tighten threshold voltage distribution 502 to a new S0. If the memory cell was in state S0 and the data to be written to the second page is "0," then the memory cell is moved to state S2 (threshold voltage distribution 506). State S2 has a verify point (lowest voltage) of C*. If the memory cell was in state S4 and the data to be written to the memory cell is "1" then the memory cell remains in S4. However, state S4 is tightened by moving the memory cells from threshold voltage distribution 504 to threshold voltage distribution 508 for state S4, as depicted in FIG. 9C. Threshold voltage distribution 508 has a verify point of E* (as compared to E** of threshold voltage distribution 504). If the memory cell is in state S4 and the data to be written to the second page is a "0" then the memory cell has its threshold voltage moved to state S6 (threshold voltage distribution 510), with a verify point of G*.

Figure 9D:
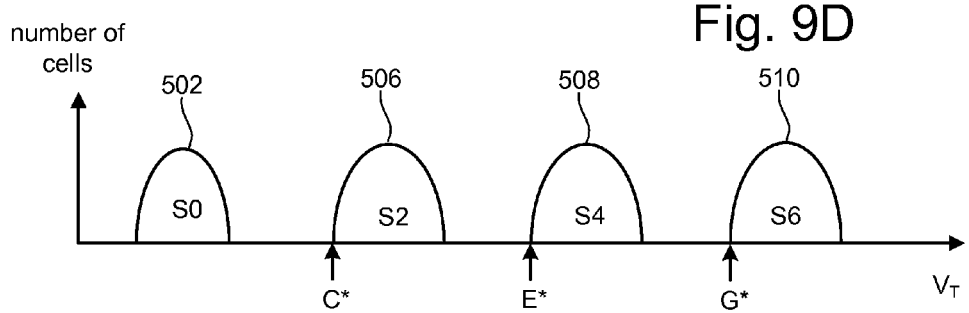

After the adjacent memory cells are programmed, the states S2, S4 and S6 are widened due to the floating gate to floating gate coupling, as depicted by threshold voltages distributions 506, 508 and 510 of FIG. 9D. In some cases, state S0 may also widen.

FIGS. 9E, 9F, 9G and 9H depict the programming of the third page. While one graph can be used to show the programming, the process is depicted in four graphs for visibility reasons. After the second page has been programmed, the memory cells are either in states S0, S2, S4 or S6. FIG. 9E shows the memory cells that are in state S0 being programmed for the third page. FIG. 9F shows the memory cells that are in state S2 being programmed for the third page. FIG. 9G shows the memory cells that are in state S4 being programmed for the third page. FIG. 9H shows the memory cells that are in state S6 being programmed for the third page. FIG. 9I shows the threshold voltage distributions after the processes of FIGS. 9E, 9F, 9G and 9H have been performed on the population of memory cells (concurrently or serially).

If a memory cell is in state S0 and the third page data is "1" then the memory cell remains at state S0. If the data for the third page is "0" then the threshold voltage for the memory cell is raised to be in state S1, with a verify point of B (see FIG. 9E).

If a memory cell is in state S2 and the data to be written in the third page is "1," then the memory cell will remain in state S2 (see FIG. 9F). However, some programming will be performed to tighten the threshold distribution 506 to a new state S2 with a verify point of C volts. If the data to be written to the third page is "0," then the memory cell will be programmed to state S3, with a verify point of D volts.

If a memory cell is in state S4 and the data to be written to the third page is "1" then the memory cell will remain in state S4 (see FIG. 9G). However, some programming will be performed so that threshold voltage distribution 508 will be tightened to new state S4 with a verify point of E. If a memory cell is in state S4 and the data to be written to the third page is "0" then the memory cell will have its threshold voltage raised to be in state S5, with a verify point of F (see FIG. 9G).

If the memory cell is in state S6 and the data to be written to the third page is "1" then the memory cell will remain in state S6 (see FIG. 9H). However, there will be some programming so that the threshold voltage distribution 510 is tightened to be in new state S6, with a verify point at G. If the third page data is "0" then the memory cell will have its threshold voltage programmed to state S7, with a verify point at H (see FIG. 9H). At the conclusion of the programming of the third page, the memory cell will be in one of the eight states depicted in FIG. 9I.

FIG. 8 depicts one example of an order for programming the pages of a set of memory cells in a block. The table provides the order for programming with respect to four word lines (WL0, WL1, WL2 and WL3) in the same block fusing numbers 1-12); however, the table can be adapted to accommodate more or less than four word lines. The first page of the memory cells connected to WL0 are programmed, followed by the programming of the first page of the memory cells connected to WL1, followed by the programming of the second page of the memory cells connected to WL0, followed by the programming of the first page of the memory cells connected to WL2, followed by the programming of the second page of the memory cells connected to WL1, etc.

Figure 10A:
FIGS. 10A-E show various threshold voltage distributions and describe a process for programming non-volatile memory.
Figure 10B:
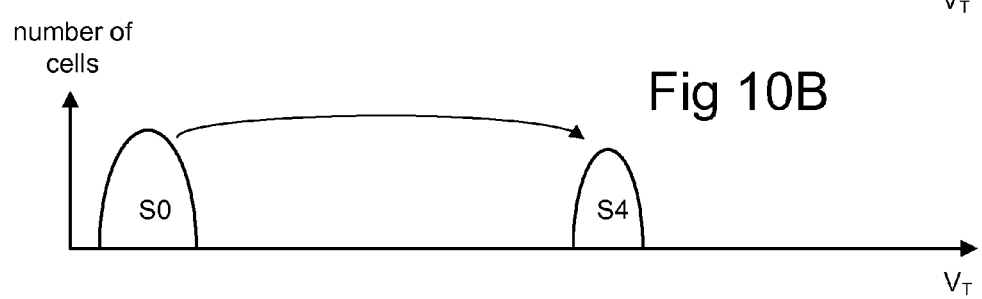
Figure 10C:
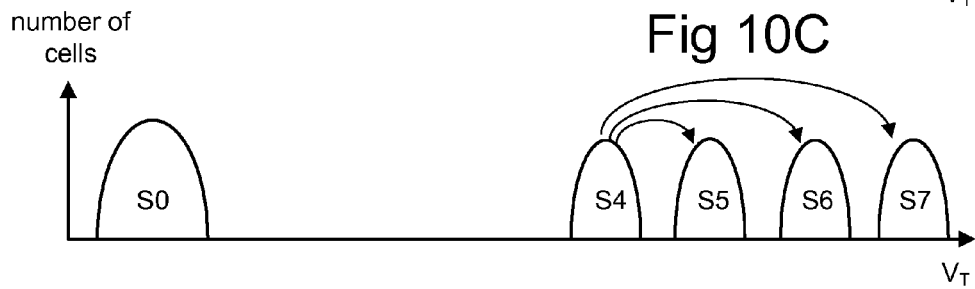
Figure 10D:
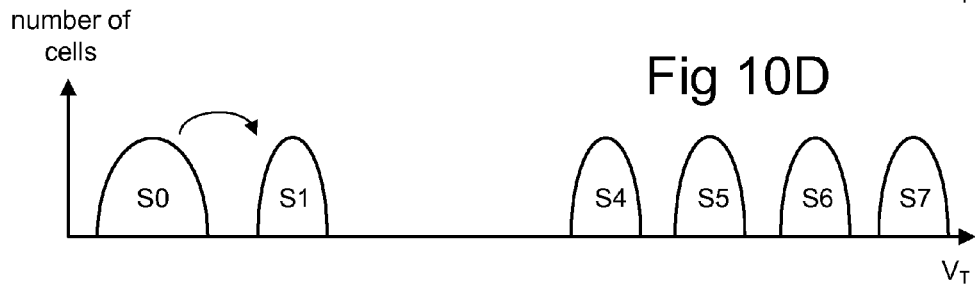
Figure 10E:
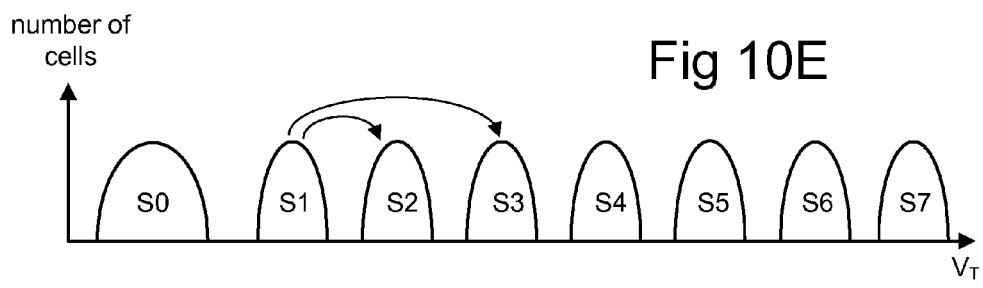

FIGS. 10A-E (which plot $V_T$ versus number of cells) disclose another process for programming non-volatile memory for non-volatile memory cells that store three bits of data per memory cell and uses four steps. Before programming, all of the memory cells are in state S0, the erased state (FIG. 10A). The first step includes programming the memory cells for the higher states S4-S7. FIG. 10B shows programming to state S4 for those memory cells that are to be finally programmed to S4-S7. FIG. 10C shows the second step, which includes programming from state S4 to states S5-S7. FIG. 10D shows the third step, which includes programming from state S0 to state S1. FIG. 10E shows the fourth step, which includes programming from state S1 to states S2 and S3.

Figure 11:
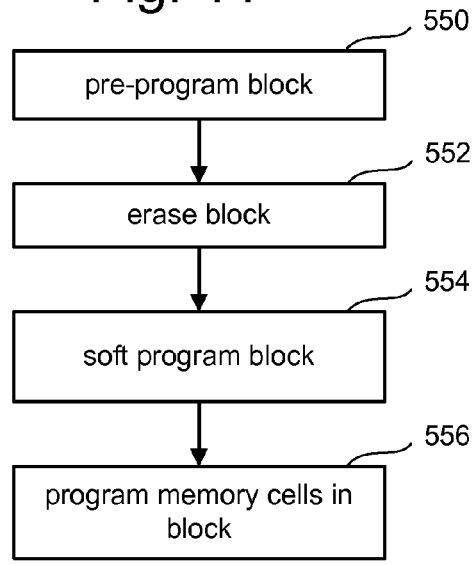
FIG. 11 depicts a flow chart describing one embodiment of a process for programming non-volatile memory.

FIG. 11 is a flow chart describing a programming process for programming memory cells connected to a selected word line. In one embodiment, the process of FIG. 11 is used to program a block of memory cells. In one implementation of the process of FIG. 11, memory cells are pre-programmed in order to maintain even wear on the memory cells (step 550). In one embodiment, the memory cells are preprogrammed to state S7, a random pattern, or any other pattern. In some implementations, pre-programming need not be performed.

In step 552, memory cells are erased (in blocks or other units) prior to programming. Memory cells are erased in one embodiment by raising the p-well to an erase voltage (e.g., 20 volts) for a sufficient period of time and grounding the word lines of a selected block while the source and bit lines are floating. A strong electric field is thus applied to the tunnel oxide layers of selected memory cells and the selected memory cells are erased as electrons of the floating gates are emitted to the substrate side, typically by Fowler-Nordheim tunneling mechanism. As electrons are transferred from the floating gate to the p-well region, the threshold voltage of the selected memory cells are lowered. Erasing can be performed on the entire memory array, on individual blocks, or another unit of cells. In one embodiment, after erasing the memory cells, all of the erased memory cells will be in state S0.

At step 554, soft programming is performed to narrow the distribution of erased threshold voltages for the erased memory cells. Some memory cells may be in a deeper erased state than necessary as a result of the erase process. Soft programming can apply programming pulses to move the threshold voltage of the deeper erased memory cells to state S0 (or state E). In step 556, the memory cells of the block are programmed as described herein. The process of FIG. 11 can be performed at the direction of the state machine, controller or combination of state machine and controller, using the various circuits described above. For example, the controller may issue commands and data to the state machine to program the data. In response, the state machine may operate the circuits described above to carry out the programming operations. After performing the process of FIG. 11, the memory cells of the block can be read.

Figure 12:
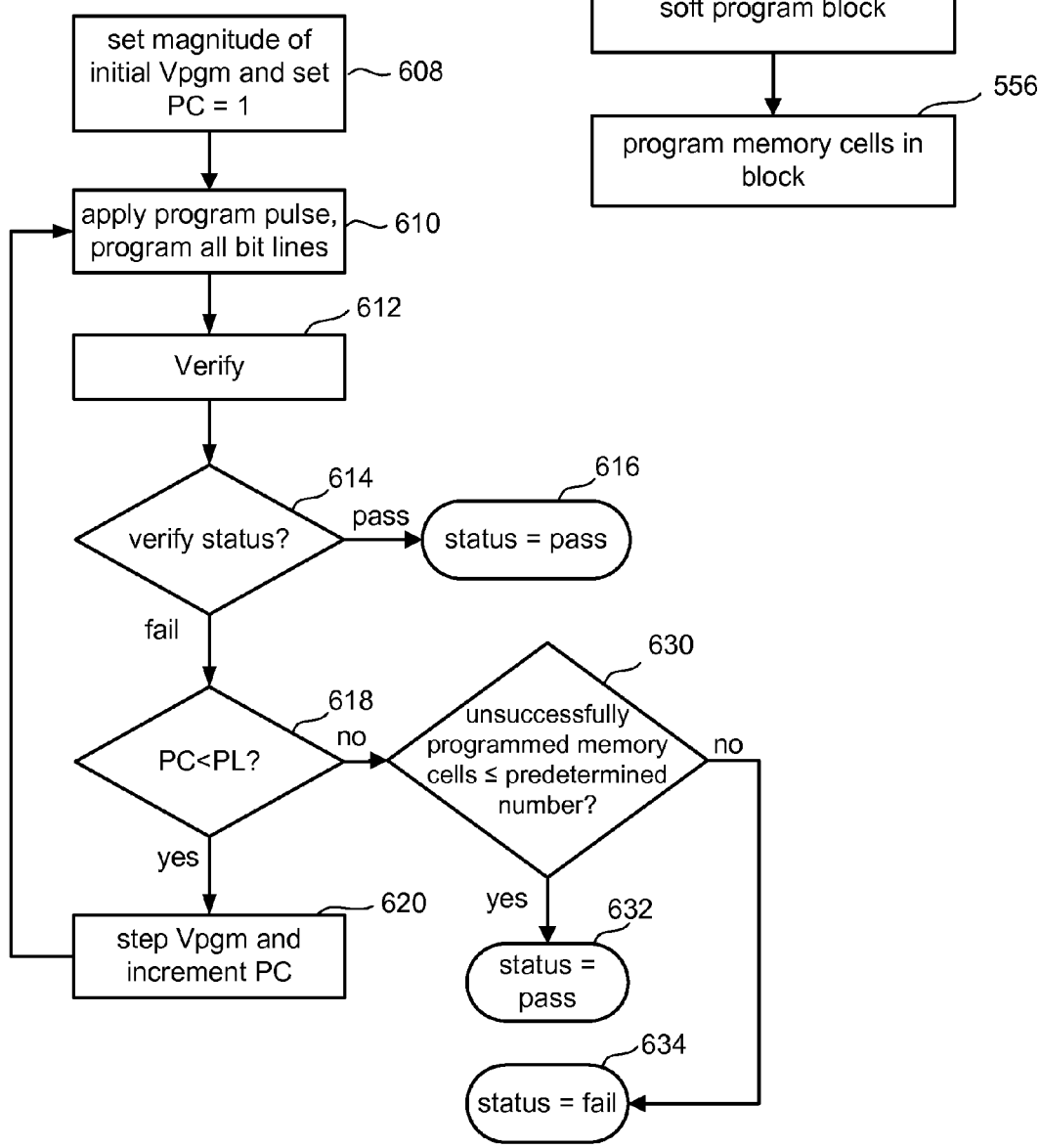
FIG. 12 depicts a flow chart describing one embodiment of a process for programming non-volatile memory elements.

FIG. 12 is a flow chart describing one embodiment of a process for performing programming on memory cells connected to a common word line. The process of FIG. 12 can be performed one or multiple times during step 556 of FIG. 12. For example, when programming binary data (see e.g., FIG. 7), the process of FIG. 12 is performed once for each word line of a block during step 556. When programming multi-state data, the process of FIG. 12 can be used to perform the full sequence programming of FIG. 7, in which case the process of FIG. 12 would be performed once for each word line. In one embodiment, the programming process is performed in an order that starts from the word line closest to the source line, working toward the bit line. The process of FIG. 12 can also be used to perform the programming of a page of data for a word line, with respect to the programming process of FIGS. 9A-I, in which case the process of FIG. 12 would be performed three times for each word line. The process of FIG. 12 can also be used to separately perform each step of the four steps of FIGS. 10A-10E. The process of FIG. 12 is performed at the direction of the state machine 222.

Typically, the program voltage applied to the control gate during a program operation is applied as a series of program pulses. In between programming pulses are a set of verify pulses to enable verification. In many implementations, the magnitude of the program pulses is increased with each successive pulse by a predetermined step size. In step 608 of FIG. 12, the programming voltage (Vpgm) is initialized to the starting magnitude (e.g., ~12-16V or another suitable level) and a program counter PC maintained by state machine 222 is initialized at 1. In step 610, a program pulse of the program signal Vpgm is applied to the selected word line (the word line selected for programming). The unselected word lines receive one or more boosting voltages (e.g., ~9 volts) to perform boosting schemes known in the art. If a memory cell should be programmed, then the corresponding bit line is grounded. On the other hand, if the memory cell should remain at its current threshold voltage, then the corresponding bit line is connected to $V_{DD}$ to inhibit programming. More information about boosting schemes can be found in U.S. Pat. No. 6,859,397 and U.S. patent application Ser. No. 11/555,850, both of which are incorporated herein by reference.

In step 610, the program pulse is concurrently applied to all memory cells connected to the selected word line so that all of the memory cells connected to the selected word line are programmed together. That is, they are programmed at the same time (or during overlapping times). In this manner all of the memory cells connected to the selected word line will concurrently have their threshold voltage change, unless they have been locked out from programming.

In step 612, the states of the selected memory cells are verified using the appropriate set of target levels. Step 612 of FIG. 12 includes performing one or more verify operations. In general, during verify operations and read operations, the selected word line is connected to a voltage, a level of which is specified for each read (e.g., see read compare levels Vr1, Vr2, Vr3, Vr4, Vr5, Vr6, and Vr7 of FIG. 6A) and verify operation (e.g. see verify levels Vv1, Vv2, Vv3, Vv4, Vv5, Vv6 and vv7 of FIG. 6A) in order to determine whether a threshold voltage of the concerned memory cell has reached such level. After applying the word line voltage, the conduction current of the memory cell is measured to determine whether the memory cell turned on in response to the voltage applied to the word line. If the conduction current is measured to be greater than a certain value, then it is assumed that the memory cell turned on and the voltage applied to the word line is greater than the threshold voltage of the memory cell. If the conduction current is not measured to be greater than the certain value, then it is assumed that the memory cell did not turn on and the voltage applied to the word line is not greater than the threshold voltage of the memory cell.

There are many ways to measure the conduction current of a memory cell during a read or verify operation. In one example, the conduction current of a memory cell is measured by the rate it discharges or charges a dedicated capacitor in the sense amplifier. In another example, the conduction current of the selected memory cell allows (or fails to allow) the NAND string that included the memory cell to discharge the corresponding bit line. The voltage on the bit line is measured after a period of time to see whether it has been discharged or not. Note that the technology described herein can be used with different methods known in the art for verifying/reading. More information about verifying/reading can be found in the following patent documents that are incorporated herein by reference in their entirety: (1) United States Patent Application Pub. No. 2004/0057287, "Non-Volatile Memory And Method With Reduced Source Line Bias Errors," published on Mar. 25, 2004; (2) United States Patent Application Pub No. 2004/0109357, "Non-Volatile Memory And Method with Improved Sensing," published on Jun. 10, 2004; (3) U.S. Patent Application Pub. No. 20050169082; and (4) U.S. Patent Publication 2006/0221692, titled "Compensating for Coupling During Read Operations of Non-Volatile Memory," Inventor Jian Chen, filed on Apr. 5, 2005.

If it is detected that the threshold voltage of a selected memory cell has reached the appropriate target level, then the memory cell is locked out of further programming by, for example, raising its bit line voltage to Vdd during subsequent programming pulses.

Looking back at FIG. 12, in step 614 it is checked whether all of memory cells have reached their target threshold voltages. If so, the programming process is complete and successful because all selected memory cells were programmed and verified to their target states. A status of "PASS" is reported in step 616. Note that in some implementations, in step 614 it is checked whether at least a predetermined number of memory cells have been properly programmed. This predetermined number can be less than the number of all memory cells, thereby allowing the programming process to stop before all memory cells have reached their appropriate verify levels. The memory cells that are not successfully programmed can be corrected using error correction during the read process.

If, in step 614, it is determined that not all of the memory cells have reached their target threshold voltages, then the programming process continues. In step 618, the program counter PC is checked against a program limit value (PL). One example of a program limit value is 20; however, other values can be used. If the program counter PC is not less than the program limit value, then it is determined in step 630 whether the number of memory cells that have not been successfully programmed is equal to or less than a predetermined number. If the number of unsuccessfully programmed memory cells is equal to or less than the predetermined number, then the programming process is flagged as passed and a status of PASS is reported in step 632. In many cases, the memory cells that are not successfully programmed can be corrected using error correction during the read process. If however, the number of unsuccessfully programmed memory cells is greater than the predetermined number, the program process is flagged as failed and a status of FAIL is reported in step 634.

If, in step 618, it is determined that the Program Counter PC is less than the Program Limit value PL, then the process continues at step 620 during which time the Program Counter PC is incremented by 1 and the program voltage Vpgm is stepped up to the next magnitude. For example, the next pulse will have a magnitude greater than the previous pulse by a step size (e.g., a step size of 0.1-0.4 volts). After step 620, the process loops back to step 610 and another program pulse is applied to the selected word line.

To provide the user of the memory system with faster programming performance, one embodiment of the memory system first stores data as binary data. For example, the process of FIGS. 11 and 12 are used to store data as depicted in FIG. 7 (or as in another scheme). Subsequently, the binary data is re-programmed as multi-state data. When re-programming the binary data as multi-state data the processes of FIGS. 11 and 12 can be used to implement the programming schemes of FIG. 7A, 9A-I, 10A-E, or another scheme. In one embodiment, the system tries to first use a block of memory cells to store binary data. After X cycles of erasing and storing binary data, a particular block will then be used to store multi-state data. For example, if a file to be stored contains three blocks of data, those block of data will first be stored as binary data in three separate blocks. Subsequently, three blocks if binary data will be re-programmed into a single block as multi-state data with three bits per memory cell. In one embodiment, the value of X will be the number of bits data stored in each memory cell. For example, if the memory cells store three it's of multi-state data, then a given block will be used to store binary data three times. After the third time binary data is stored in the given block, that given block will be used to store multi-state data.

Figure 13:
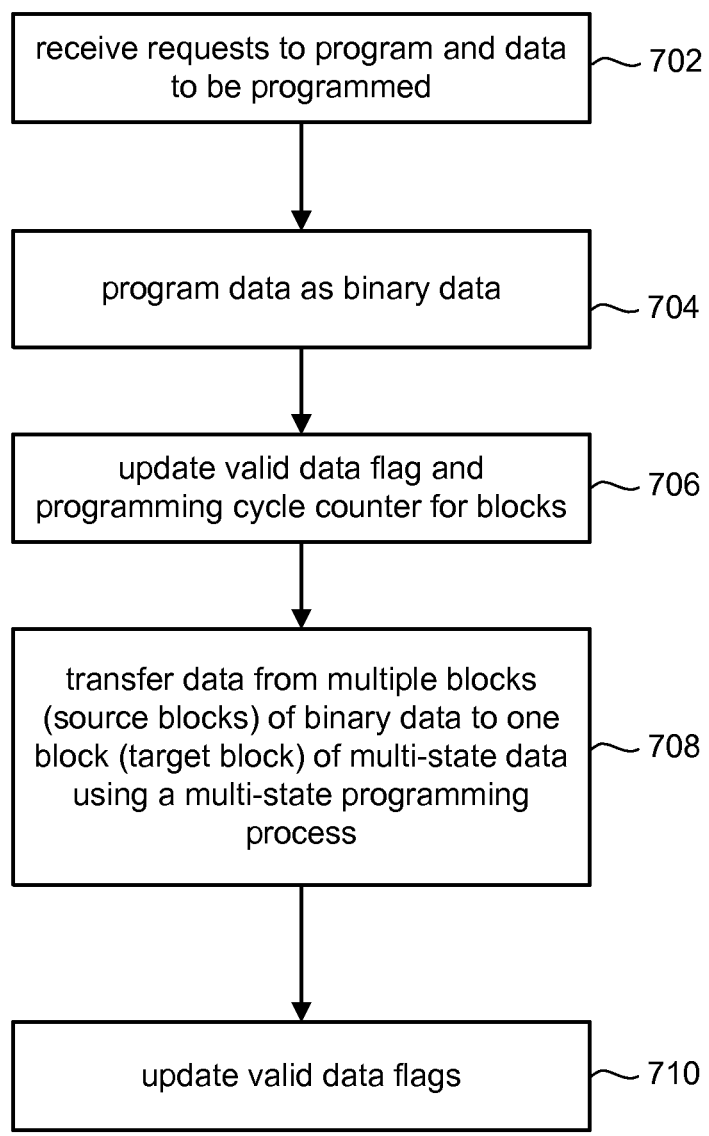
FIG. 13 is a flow chart describing one embodiment of a process of for programming non-volatile memory elements using a binary programming process and a multi-state programming process.

FIG. 13 is a flow chart describing one embodiment of a process for first storing data as binary data and subsequently storing the data as multi-state data. In step 702, the system (controller, state machine, or other component) will receive one or more requests to program data. The data to be programmed will also be received. In step 704, the data is programmed as binary data into one or more blocks. In one embodiment, step 704 includes using the process of FIGS. 11 and 12 to program data as depicted in FIG. 7. The number of blocks used will depend on the amount of data to be programmed. Once the data has been written in step 704, the system can report that the programming process is complete and/or start another programming process. Thus, the user or host will experience the fast programming of binary data. In step 706 of FIG. 13, the appropriate one or more cycle counts for the block programmed in step 704 are incremented.

In step 708, data from multiple blocks storing binary data (the source blocks) are transferred to a new block (target block) by storing that data in the new block as multi-state data. If the multi-state data includes two bits per memory cell, then binary data from two blocks will be transferred to one block of multi-state data. If the multi-state data includes three bits per memory cell, then binary data from three blocks will be transferred to one block of multi-state data. If the multi-state data includes four bits per memory cell, then binary data from four blocks will be transferred to one block of multi-state data. And so on. In one embodiment, the transfer of data from the blocks storing binary data to a block storing multi-state data (step 708) is performed as soon as there is enough data to fill up a multi-state block. In another embodiment, the transfer of data from the blocks storing binary data to a block storing multi-state data (step 708) is performed during times when the memory system is idle. Other times can also be used.

In one embodiment, each block will include a valid data flag that will indicate whether that block has valid data. That flag can be stored in a memory cell, in a register with the state machine or in a register with the controller. When binary data is written in step 704, the appropriate valid data flags are set to indicate that the blocks written to have valid binary data. After the binary data is re-programmed to multi-state data in a different block, the appropriate valid data flag is reset in step 710 to indicate that the data in the block is not valid and, therefore, the block can be used to program other data.

Figure 14:
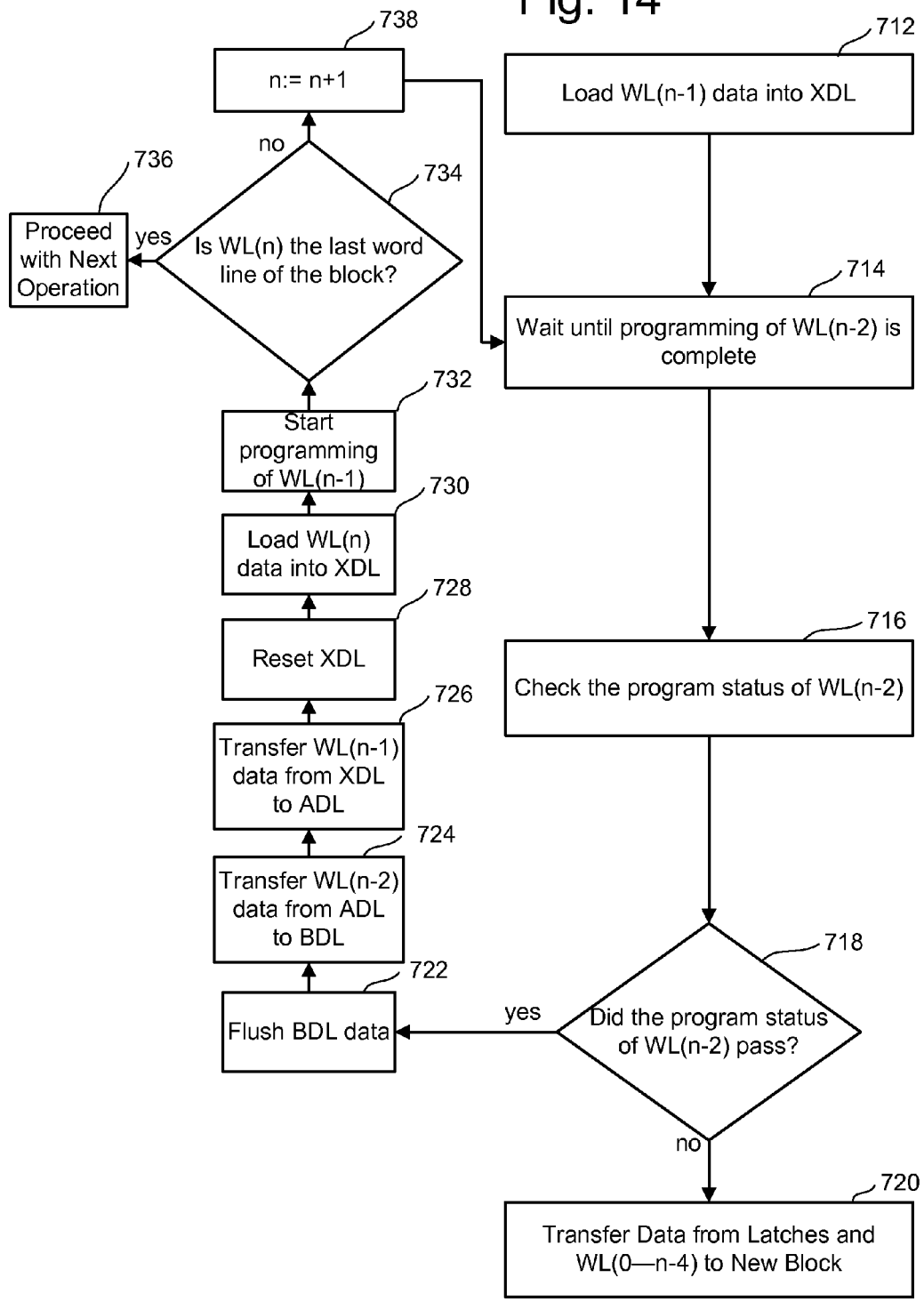
FIG. 14 depicts a flow chart describing one embodiment of a process for programming binary data into blocks.

FIG. 14 is a flow chart depicting one embodiment of a process for programming data to non-volatile storage elements while accounting for faults that might be detected in the block of non-volatile storage elements to which the data is being programmed. The process of FIG. 14 may be performed one or more times during step 704 of FIG. 13, or during any other binary data programming process. The process of FIG. 14 may also be performed during a multi-state data programming process.

In one example, the process of FIG. 14 is performed during "sequential programming," in which adjacent word lines on a block of memory cells are programmed one after another, starting with WL0_i (for block i, as in FIG. 4) and continuing toward the drain side of the block.

Let 'WL(n)' (with "n" as the numerical index) denote a word line that the system has yet to program for a given block of memory cells, which the system is programming via sequential programming. For the purposes of this discussion, the system has programmed word lines WL(0) through WL(n−3). Thus, the system also has yet to program word lines WL(n−2) and WL(n−1). Suppose the data to be programmed into WL(n−2) is in latch ADL. Furthermore, suppose the system has already begun to program WL(n−2) from the data in ADL. In step 712, the system loads into XDL the data to be programmed into WL(n−1). This data may come from I/O interface 496, for example. In step 714, the system waits until the programming of WL(n−2), begun before step 714, is complete. In some embodiments, the system may wait for a predetermined number of clock cycles before proceeding, though the system may employ other methods for performing step 714. In some embodiments, during the execution of step 714, the system continually issues commands in order to monitor the progress of the programming operation. The system continues to issue these commands until the system has received a value indicating that the programming operation has completed. In step 716, the system checks the program status of WL(n−2). Checking the program status of a word line accomplishes at least two tasks: ensuring that the programming operation on the word line has completed, and that the word line was programmed correctly. If the above conditions obtain, then the program status of the word line is considered to have "passed". In some embodiments, whether or not the program status has passed depends on the kind of value received in response to the command issued at the end of step 714; though more than one kind of value received by the system may terminate step 714, the kind of value received may further determine whether or not the program status has passed. In step 718, the system decides how to proceed given the program status of WL(n−2). If the program status of WL(n−2) has not passed, then WL(n−2) may have been programmed improperly due to a word line to word line short circuit between WL(n−2) and WL(n−3). In this case, the system proceeds to step 720, in which the system transfers the data currently held in the latches, as well as the previously programmed word lines, into another block for safekeeping. More detail is provided in FIG. 14A.

If, in step 718, the system has decided that the program status of WL(n−2) has passed, then the system proceeds to step 722, in which the data held in BDL is flushed. In some embodiments, this is the data that was programmed into WL(n−3) Following step 722, in step 724, the system transfers the data held in ADL, which was successfully programmed into WL(n−2), into BDL. In step 726, the system transfers the data to be programmed into WL(n−1) from XDL into ADL. In step 728, the system resets latch XDL to accept new data. In step 730, the system loads the data to be programmed into WL(n) into XDL. In step 732, the system begins programming WL(n−1) from ADL. In step 734, the system determines whether WL(n) is the last word line of the current block to be programmed, which is typically the word line closest to the drain side of the block (i.e. closest to SGD_i, as depicted in FIG. 4). If WL(n) is the last word line of the current block to be programmed, then in step 736, the system proceeds with the next operation. In some embodiments, this next operation involves a similar sequence to the preceding steps, but with the data currently held in the latches. In one embodiment, the system finishes programming WL(n−1) and checks the program status of WL(n−1). If the program status of WL(n−1) fails, then the system transfers the data currently held in the latches, along with all the data correctly programmed into the current block, into a New Block, similar to step 720. If the program status of WL(n−1) passes, then the system programs and checks the program status of WL(n). If the program status of WL(n) fails, then the system transfers the data held in the latches, along with all the data correctly programmed into the current block, into a New Block, similar to step 720. If the program status of WL(n) passes, or once the cases of WL(n−1) and WL(n) have been handled as above, the system may proceed with programming another block, or another task. In step 734, if the system determines that WL(n) is not the last word line of the current block to be programmed, then in step 738, the system increments the variable "n", by which word lines in the current block are indexed, by 1, in order to continue the process described above in the word lines of the current block that have yet to be programmed. The description of step 738 here is just one example of many ways that the system may continue the loop of the process of FIG. 14 in the current block. After step 738, the system returns to step 714.

As can be seen, FIG. 14 is a loop. For example, consider three word lines WL3, WL4 and WL5. During a first iteration, data for WL3 may be loaded into XDL, transferred to ADL and programmed. During a second iteration, data for WL4 may be loaded into XDL, data for WL3 is checked to see if it was correctly stored by the programming process, data for WL3 may be moved to BDL, data for WL4 is transferred to ADL and the data for WL4 programmed from ADL. During a third iteration, data for WL5 may be loaded into XDL, data for WL4 is checked to see if it was correctly stored by the programming process, data for WL4 is moved to BDL, data for WL5 is transferred to ADL and the data for WL5 programmed from ADL.

Figure 14A:
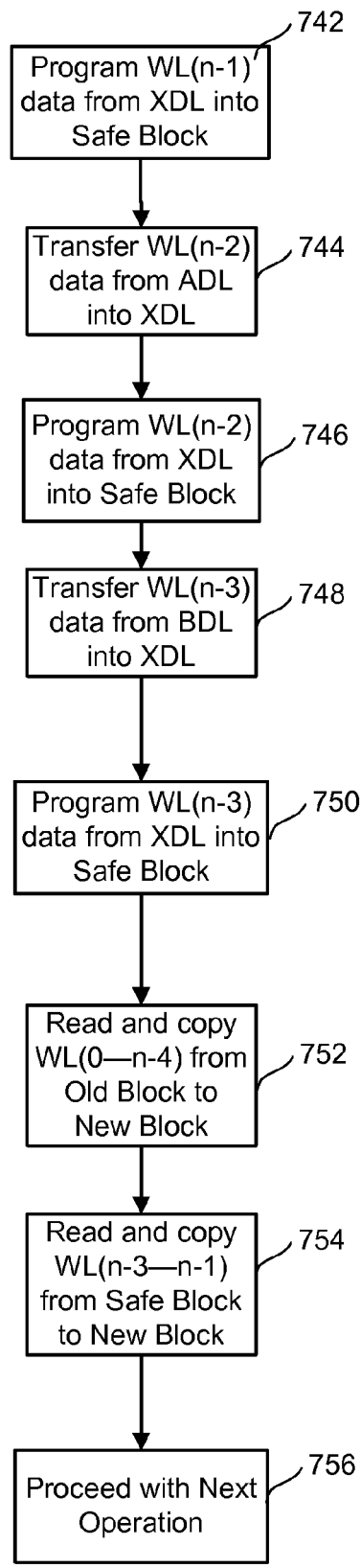
FIG. 14A is a flow chart describing a process of transferring data from a faulty block into a new block using latches.

FIG. 14A is a flow chart describing a process of transferring data from a faulty block into a new block using latches XDL, ADL, and BDL. The process of FIG. 14A is one example implementation of step 720 of FIG. 14. Since the system has discovered a programming error on the block being programmed, which will be referred to as the "Old Block," all of the data currently programmed on the Old Block, namely WL(0) through WL(n−4), along with the data currently held in latches XDL (intended for WL(n−1)), ADL (intended for WL(n−2)), and BDL (intended for WL(n−3)), must be transferred to another block, which will be referred to as the "New Block." In some embodiments, all of the data from a word line in the Old Block is transferred to a word line in the New Block. In other embodiments, this data is split among multiple word lines in the New Block.

In step 742, the system programs the data held in XDL into an intermediary block which will be referred to as the "Safe Block." In some embodiments, the Safe Block is a specially designated block of memory cells useful in processes such as that of FIG. 14A for keeping data safe until it is ready to be programmed into a block such as the New Block. In some embodiments, the Safe Block is necessary because the data on WL(0) through WL(n−4) must first be programmed into the New Block in order to replicate the sequential programming of the Old Block, and since latches XDL, ADL, and BDL will be used to transfer data from the Old Block to the New Block, the data currently on the latches must be stored in Safe Block for safekeeping. In step 744, the system transfers the data held in ADL into XDL. In step 746, the system programs this data in XDL into the Safe Block. In step 748, the system transfers the data held in BDL into XDL. In step 750, the system programs the data held in XDL into the Safe Block.

Once the contents of the latches (i.e. the data intended for WL(n−1), WL(n−2), and WL(n−3)), in step 752, the system reads the data stored in WL(0) through WL(n−4) in the Old Block and programs this data to corresponding locations in the New Block. In some embodiments, when reprogramming this data to the New Block, the system uses the processes of FIGS. 11 and 12 to program data as depicted in FIG. 7. The system can also employ the process of FIG. 14 to ensure that if the New Block is found to be faulty, the data can still be saved to another location. In step 754, the system retrieves the data stored in the Safe Block in steps 742-750 and stores this data to locations in the New Block corresponding to WL(n−3), WL(n−2), and WL(n−1) in the Old Block, as appropriate. In some embodiments, the system retrieves the data by performing read operations on the Safe Block, and transfers the data to the New Block using processes such as that described in FIGS. 7, 11, 12, and 14. In step 756, the system proceeds to the next operation. In some embodiments, the system initiates sequential programming in a block that has not yet been programmed.

Figure 15:
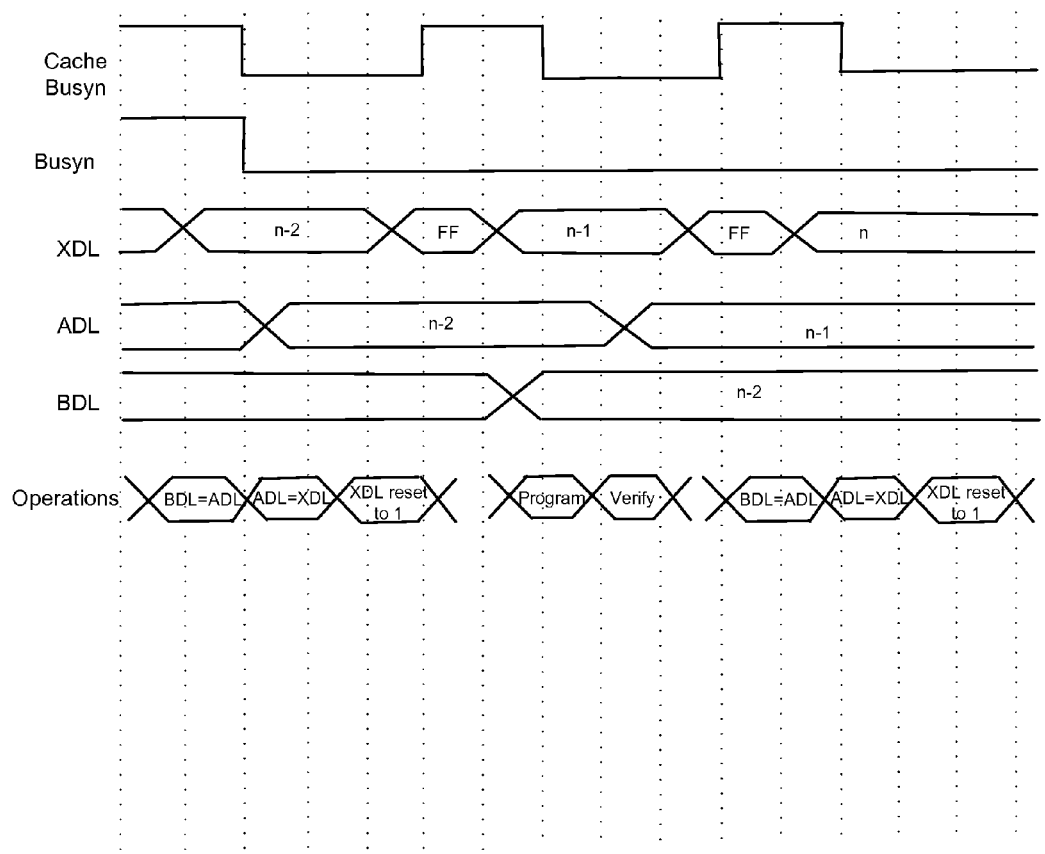
FIG. 15 depicts a timing diagram describing the data transfers occurring during the process of FIG. 14.

FIG. 15 is a timing diagram depicting the process of FIG. 14 (following the loop starting from step 726 around up to step 712 and then step 730 again). The various signals depicted in FIG. 15 are synchronized by a global clock signal (not shown). The signal labeled 'CacheBusyn' indicates when the XDL latch is busy. In FIG. 15, the periods during which CacheBusyn is high indicate when XDL is being reset to be loaded with new data. The signal labeled 'Busyn' indicates that memory array 200 is busy, but this signal goes down after Cache Busyn goes high for the first time so that the system can program the word lines on the memory as necessary.

Signal XDL corresponds to the status of the XDL latch. As shown, the first data stored in XDL is "n−2" (the data to be programmed into WL(n−2)), as at some point, this data was loaded into XDL. Signal ADL corresponds to the status of the ADL latch. Soon after the data to be programmed into WL(n−2) is loaded into XDL, loads this data into ADL (as shown by the region of the ADL signal labeled "n−2), corresponding to step 726 of FIG. 14.

Once latch XDL copied its data into ADL, latch XDL is reset, corresponding to step 728 of FIG. 14. In the timing diagram of FIG. 15, this is shown by the duration of signal XDL labeled "FF". Corresponding to step 730 of FIG. 14, after latch XDL has been reset, the data to be programmed into WL(n−1) is loaded into XDL, as shown by the portion of signal XDL labeled "n−1". The system programs WL(n−2) from ADL (not shown), corresponding to steps 732 through 718 of FIG. 14.

After the data to be programmed into WL(n−1) has been loaded into XDL, the system flushes the data currently held in latch BDL, corresponding to step 722 of FIG. 14, as shown by the unlabeled region of signal "BDL". After performing step 722, the system then shifts the data programmed into WL(n−2) from latch ADL to latch BDL, corresponding to step 724 of FIG. 14, as shown by the region of signal BDL labeled "n−2". Once BDL is loaded by the data programmed into WL(n−2), the system loads the data to be programmed into WL(n−1) into ADL, corresponding to step 726 of FIG. 14, as shown by the section of signal ADL labeled "n−1". Upon loading the data programmed into WL(n−1) into ADL, latch XDL is reset, corresponding to step 728 of FIG. 14, as shown by the transition in signal XDL from "n−1" to "FF." Soon after XDL is reset, the data to be programmed into WL(n) is loaded into XDL (corresponding to step 730 of FIG. 14), shown when the signal XDL is set to "n".

The signal labeled "Operations" indicates the state transitions of the latches. For example, when BDL is loaded with the data stored in ADL, Operations is labeled "BDL=ADL". During the first time that Operations is labeled "BDL=ADL", the data held in ADL and transferred to BDL is unspecified, but in some embodiments, the data held in ADL is loaded into BDL is a matter of routine so that ADL can be loaded from XDL without compromising any data. Thus, Operations transitions from "BDL=ADL" to "ADL=XDL", so that once the data previously held in ADL is saved in BDL, the system then loads ADL with the data held in XDL, as in the iterations of step 726 of FIG. 14. After the data held in XDL is saved in ADL, XDL is reset, shown where Operations is labeled "XDL reset to 1", corresponding to step 728 of FIG. 14. When Operations labeled "Program", the system is performing steps 732 and 714 and programming WL(n−2). When Operations is labeled "Verify", the system is verifying the programming of WL(n−2), corresponding to steps 716 and 718 of FIG. 14.

FIG. 16 is a flow chart depicting one embodiment of a process for programming data to non-volatile storage elements while accounting for faults that might be detected in the block of non-volatile storage elements to which the data is being programmed. The process of FIG. 16 may be performed one or more times during step 704 of FIG. 13. The process of FIG. 16 may be performed during "non-sequential programming," in which adjacent word lines on a block of memory cells are programmed one after another, starting, for example, with WL0_i (for block i, as in FIG. 4) and continuing toward the drain side of the block. However, unlike "sequential programming", adjacent word lines are not necessarily programmed immediately after one another, but the system may program one or more word lines on one block (block i, for example), continue programming at other blocks (blocks j, k, etc.), and then may return to program the original block (block i) starting from the next word line from the last word line to be programmed on that block (block i).

For example, referring to the case discussed in FIG. 14, suppose WL(0) through WL(n−2) have been programmed on one block (called the "Old Block", as before) before the system switches to begin programming another block. Then, suppose the system returns to the Old Block to continue programming. In order to continue programming on the Old Block, the system must begin programming at WL(n−1). However, if there is a word line to word line short between WL(n−1) and WL(n−2), the data on WL(n−2) would be corrupted. Therefore, in step 758, the system reads the previously programmed WL(n−2) and saves the data to ADL. In step 760, the system transfers the data read from WL(n−2) from XDL to ADL. In step 762, the system loads the data to be programmed into WL(n−1) into XDL. In some embodiments, the system resets XDL to accept new data between steps 760 and 762. In step 764, the system transfers the data read from WL(n−2) from ADL to BDL. In step 766, the system transfers the data to be programmed into WL(n−1) from XDL to ADL. In step 768, XDL gets reset to accept new data. In step 770, the system loads the data to be programmed into WL(n) into XDL. In step 772, the system starts the programming of WL(n−1). In step 774, the system waits until the programming of WL(n−1) has completed, similar to step 714 of FIG. 14.

In step 776, the system checks the program status of WL(n−1). The data in WL(n−1) may have been corrupted due to a number of factors, such as a word line to word line short between WL(n−1) and WL(n−2), or a similar short between WL(n−1) and WL(n). The system may use various methods known in the art to check the program status of WL(n−1), including the method described above for checking the program status of WL(n−2) for step 716 of FIG. 14. In step 778, the system decides how to proceed based on whether or not the program status (as checked during step 776) of WL(n−1) passes. If the program status of WL(n−1) does not pass, then in step 780, the system transfers all the data heretofore programmed on the current block (WL(0) to WL(n−3)) as well as the data currently held in the latches (intended for WL(n−2), WL(n−1), and WL(n)) into a new block. More detail about this process of transferring data to a safe block is provided in FIG. 16A. In some embodiments, the system may flag the current block (by changing the state of a designated bit, or using some other method known in the art) in order to prevent future programming operations to the current block, since, as discussed above, the current block may be faulty.

If, in step 778, the system decides that the program status WL(n−1) has passed, then in step 782, the system flushes the data from BDL, as there is likely no word line to word line short circuit and the system no longer has a reason to preserve the data programmed into WL(n−2). In step 784, the system transfers the data held in ADL (which was programmed into WL(n−1)) to BDL. In step 786, the system transfers the data held in XDL (which will be programmed into WL(n−1)) into ADL. In step 788, the system resets XDL to accept new data, since the data previously held in XDL was transferred into ADL in the previous step. In step 790, the system loads the data to be programmed into WL(n+1) into XDL. In step 792, the system begins to program WL(n) from ADL. In step 796, the system decides whether or not to continue programming word lines on the current block. In some cases, the decision of step 796 depends on instructions from the host from line 232. If the system decides not to continue programming on the current block, then in step 798, the system proceeds with the next operation. In some embodiments, this next operation involves a similar sequence to the preceding steps, but with the data currently held in the latches. In one embodiment, the system finishes programming WL(n) and checks the program status of WL(n). If the program status of WL(n) fails, then the system transfers the data currently held in the latches, along with all the data correctly programmed into the current block, into a New Block, similar to step 780. If the program status of WL(n) passes, then the system programs and checks the program status of WL(n+1). If the program status of WL(n+1) fails, then the system transfers the data held in the latches, along with all the data correctly programmed into the current block, into a New Block, similar to step 780. If the program status of WL(n+1) passes, or once the cases of WL(n) and WL(n+1) have been handled as above, the system may proceed with sequential or non-sequential programming on another block, or another task. If the system decides to continue programming in the current block, then in step 796, the system determines whether WL(n+1), the most recently loaded word line, is the last word line in the current block. The number of word lines in a block may vary depending on the embodiment of the disclosed technology. Usually, the last word line in block i is the word line closest to SGD_i (with reference to FIG. 4). If WL(n+1) is the last word line in the current block, then the system performs step 798. In some embodiments, the system may continue sequential or non-sequential programming in another block. If WL(n+1) is not the last word line in the block, then in step 800, the system increments the variable "n", by which word lines in the current block are indexed, by 1, in order to continue the process described above in the word lines of the current block that have yet to be programmed. The description of step 784 here is just one example of many ways that the system may continue the loop of the process of FIG. 16 in the current block. After step 800, the system returns to step 772 in order to complete the programming operation of WL(n) begun in step 792.

Figure 16A:
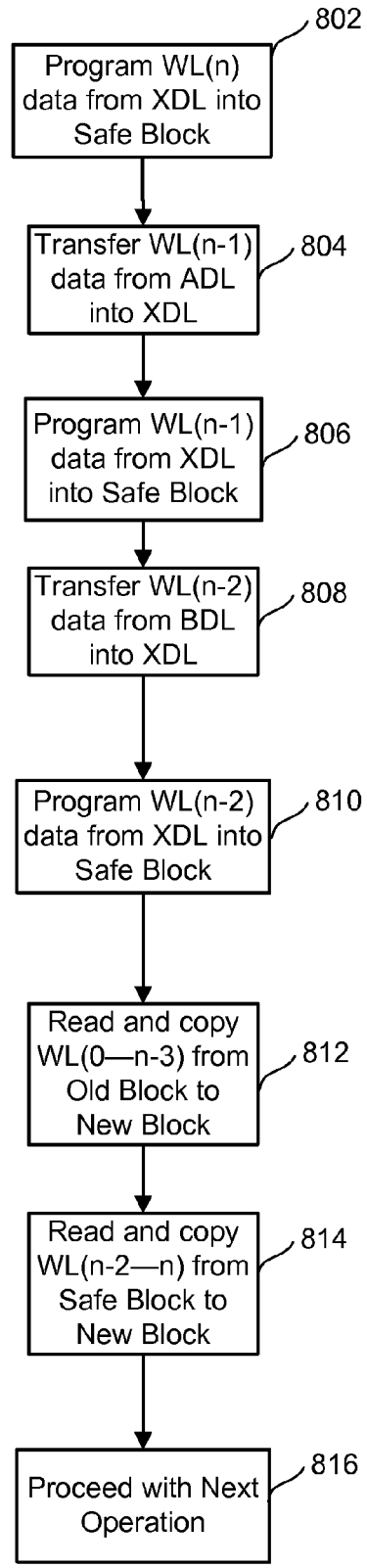
FIG. 16A is a flow chart describing a process of transferring data from a faulty block into a new block using latches.

FIG. 16A is a flow chart describing a process of transferring data from a faulty block into a new block using latches XDL, ADL, and BDL. The process of FIG. 16A is one example implementation of step 780 of FIG. 16. Since the system has discovered a programming error on the block being programmed, which will be referred to as the "Old Block," all of the data currently programmed on the Old Block, namely WL(0) through WL(n−3), along with the data currently held in latches XDL (intended for WL(n)), ADL (intended for WL(n−1)), and BDL (intended for WL(n−2)), must be transferred to another block, which will be referred to as the "New Block." In some embodiments, all of the data from a word line in the Old Block is transferred to a word line in the New Block. In other embodiments, this data is split among multiple word lines in the New Block.

In step 802, the system programs the data held in XDL into an intermediary block which will be referred to as the "Safe Block." In some embodiments, the Safe Block is a specially designated block of memory cells useful in processes such as that of FIG. 16A for keeping data safe until it is ready to be programmed into a block such as the New Block. In some embodiments, the Safe Block is necessary because the data on WL(0) through WL(n−3) must first be programmed into the New Block in order to replicate the sequential programming of the Old Block, and since latches XDL, ADL, and BDL will be used to transfer data from the Old Block to the New Block, the data currently on the latches must be stored in Safe Block for safekeeping. In step 804, the system transfers the data held in ADL into XDL. In step 806, the system programs this data in XDL into the Safe Block. In step 808, the system transfers the data held in BDL into XDL. In step 810, the system programs the data held in XDL into the Safe Block.

Once the contents of the latches (i.e. the data intended for WL(n), WL(n−1), and WL(n−2)), in step 812, the system reads the data stored in WL(0) through WL(n−3) in the Old Block and programs this data to corresponding locations in the New Block. In some embodiments, when reprogramming this data to the New Block, the system uses the processes of FIGS. 11 and 12 to program data as depicted in FIG. 7. The system can also employ the processes of FIG. 14 or 16 to ensure that if the New Block is found to be faulty, the data can still be saved to another location. In step 814, the system retrieves the data stored in the Safe Block in steps 802-810 and stores this data to locations in the New Block corresponding to WL(n−2), WL(n−1), and WL(n) in the Old Block, as appropriate. In some embodiments, the system retrieves the data by performing read operations on the Safe Block, and transfers the data to the New Block using processes such as that described in FIGS. 7, 11, 12, and 14. In step 816, the system proceeds to the next operation. In some embodiments, the system initiates sequential programming or non-sequential programming in a block that has not yet been programmed.

Figure 17:
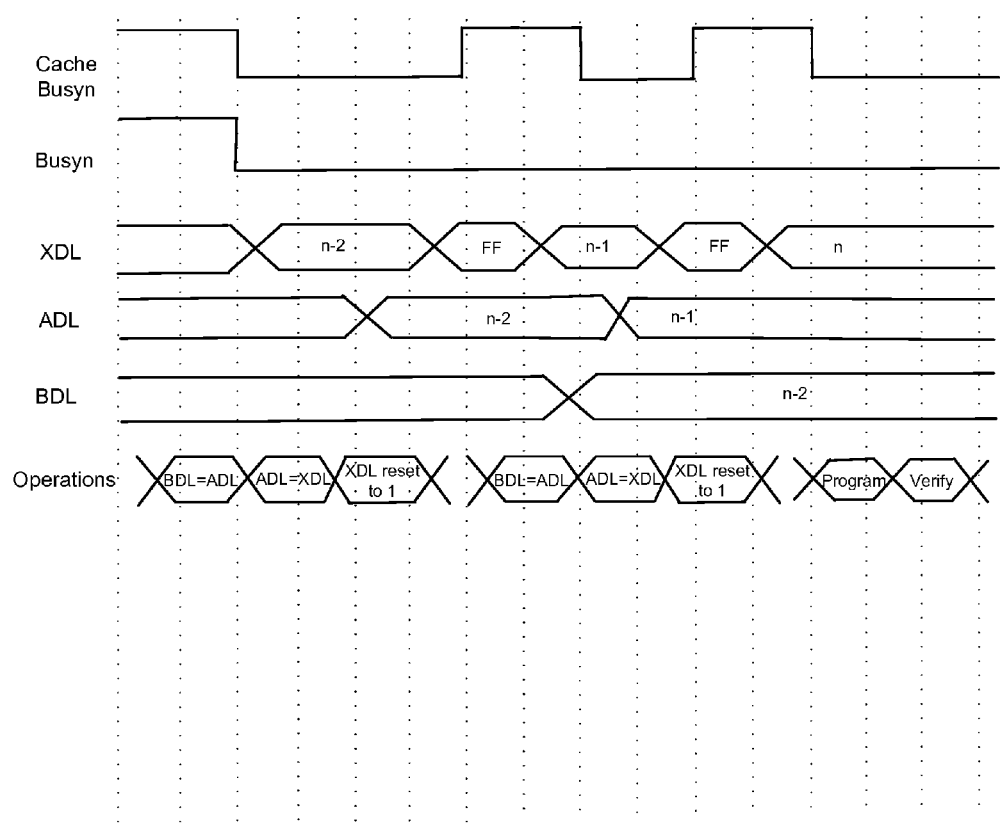
FIG. 17 depicts a timing diagram describing the data transfers occurring during the process of FIG. 16.

FIG. 17 is a timing diagram depicting the process of FIG. 16 (up to step 776). The various signals depicted in FIG. 17 are the same signals depicted in FIG. 15. Signal CacheBusyn is busy for three periods, namely during the execution of steps 758, 762 and 770 of FIG. 16, during which XDL is loaded with the data to be programmed into WL(n−2), WL(n−1) and WL(n), respectively.

The first data stored in XDL is the data read from WL(n−2) (shown by the portion of signal XDL labeled "n−2"), which corresponds to step 758 of FIG. 16. Soon after the data read from WL(n−2) is loaded into XDL, the system loads this data into ADL (as shown by the region of the ADL signal labeled "n−2), corresponding to step 760 of FIG. 16. Next, corresponding to step 762 of FIG. 16, the system loads the data to be programmed into WL(n−1) into XDL, as shown by the region of the XDL signal labeled "n−1".

Once XDL has been loaded with the data to be programmed into WL(n−1), the system transfers the data held in ADL into BDL, corresponding to step 764 of FIG. 16. Once the system has transferred the data in ADL into BDL, the system, corresponding to step 766 of FIG. 16, transfers the data held in XDL into ADL. Next latch XDL is reset in accordance with step 768 of FIG. 16. In the timing diagram of FIG. 17, this is shown by the duration of signal XDL labeled "FF". Afterward, during steps 772 and 774 of FIG. 16, the data held in ADL is programmed into WL(n−1) (not shown).

Corresponding to step 770 of FIG. 16, the system loads the data to be programmed into WL(n) into latch XDL (shown by the transition of signal XDL from "FF" to "n").

The signal labeled "Operations" indicates the state transitions of the latches. For example, when BDL is loaded with the data stored in ADL, as in step 764 of FIG. 16, Operations is labeled "BDL=ADL". When Operations is labeled "ADL=XDL", the system performs steps 760 and 766 of FIG. 16, so while the system is loading the data to be programmed into WL(n−1) into ADL from XDL, latch BDL continues to hold the data read from WL(n−2) so that the data is preserved in case there is a word line to word line short circuit between WL(n−2) and WL(n−1). After the data held in XDL is saved in ADL, XDL is reset, as in step 768 of FIG. 16, as shown where Operations is labeled "XDL reset to 1". The programming and check program status operations of WL(n−1), as performed by steps 772 through 776 of FIG. 16, are shown by the "Program" and "Verify" sequence of the Operations signal.

Figure 18:
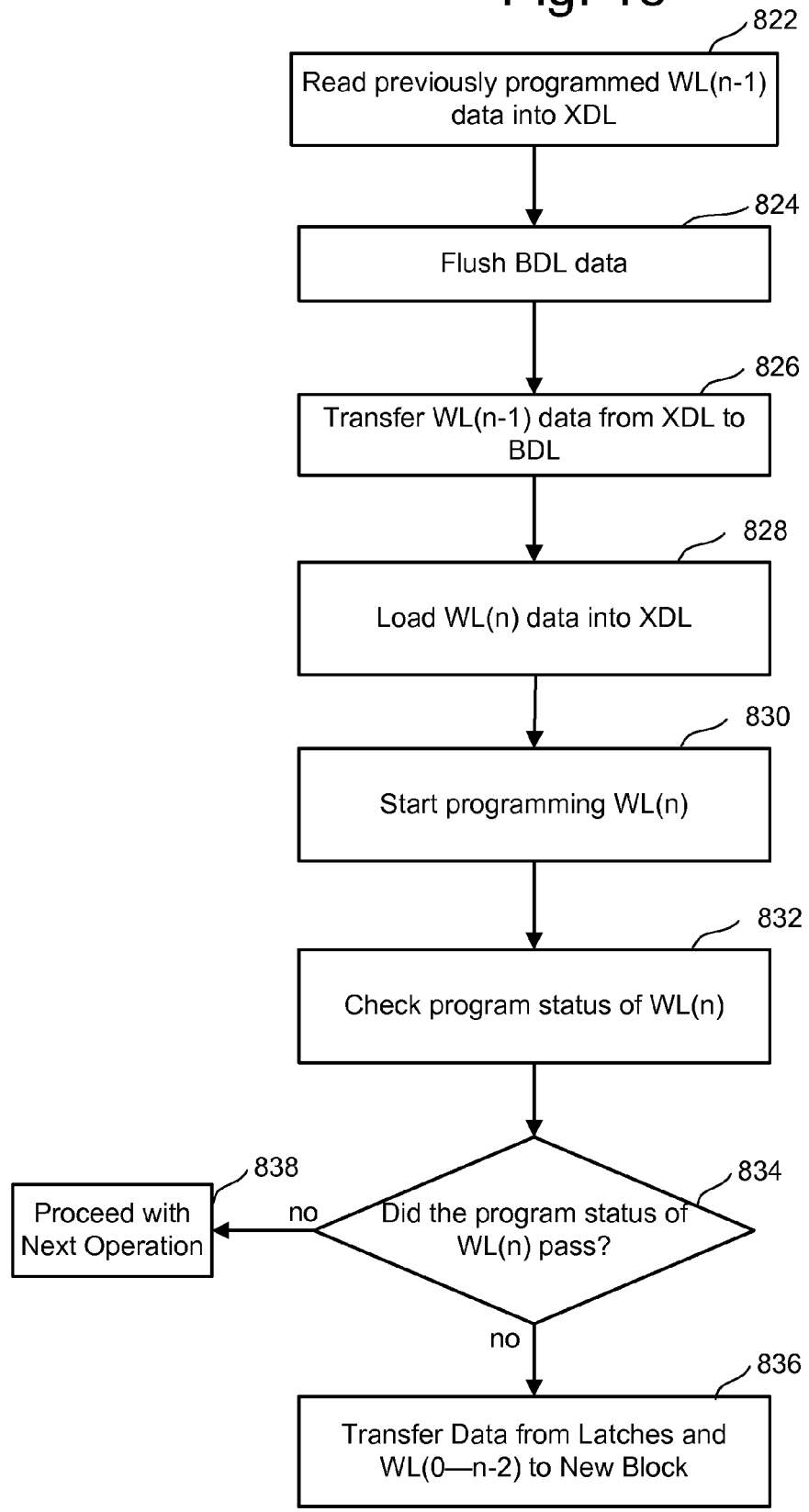
FIG. 18 depicts a flow chart describing one embodiment of a process for programming binary data into blocks.

FIG. 18 is a flow chart depicting one embodiment of a process for programming data to non-volatile storage elements while accounting for faults that might be detected in the block of non-volatile storage elements to which the data is being programmed. The process of FIG. 18 may be performed one or more times during step 704 of FIG. 13. The process of FIG. 18 may be performed during "non-sequential programming," as in the process of FIG. 16. However, in the process of FIG. 18, the command for programming data into a word line does not allow for the data to be programmed into the next word line to be simultaneously loaded into a latch. Instead, the programming and loading operations among latches XDL, ADL and BDL must be performed separately, rather than simultaneously as in the various steps of the processes of FIGS. 14 and 16.

Suppose the system has already programmed WL(0) through WL(n−1) on the Old Block. Before programming WL(n), the system must make sure that if there is a fault such as a word line to word line short circuit between WL(n) and WL(n−1), the data on WL(n−1) must be preserved in order to be programmed elsewhere. Thus, in step 822, the system reads the previously programmed WL(n−1) and saves the data to XDL. In step 824, the system flushes whatever data, if any, is currently in latch BDL. In step 826, the system transfers the data read from WL(n−1) (now in XDL) into BDL. In step 828, the system loads the data to be programmed into WL(n) into XDL. In some embodiments, the system resets XDL to accept new data at some point between step 822 and step 828. In step 830, the system starts programming WL(n) from XDL. In some embodiments, the data for WL(n) is first moved to ADL and then programmed from ADL. In step 832, the system checks the program status of WL(n), similar to step 776 of FIG. 16 or step 716 of FIG. 14. In step 834, the system decides how to proceed based on whether the program status of WL(n) has passed or not.

If the program status of WL(n) has not passed, then in step 802, the system transfers all the data heretofore programmed on the current block (WL(0) to WL(n−2)) as well as the data currently held in the latches (intended for WL(n−1) and WL(n)) into a new block. More detail about this process of transferring data to a safe block is provided in FIG. 18A. In some embodiments, the system may flag the current block (by changing the state of a designated bit, or using some other method known in the art) in order to prevent future programming operations to the current block, since, as discussed above, the current block may be faulty.

If, in step 834, the system determines that the data in WL(n−1) has not been corrupted, then in step 838, the system proceeds with the next operation. In some embodiments, the system may continue sequential or non-sequential programming in the current block or another block.

Figure 18A:
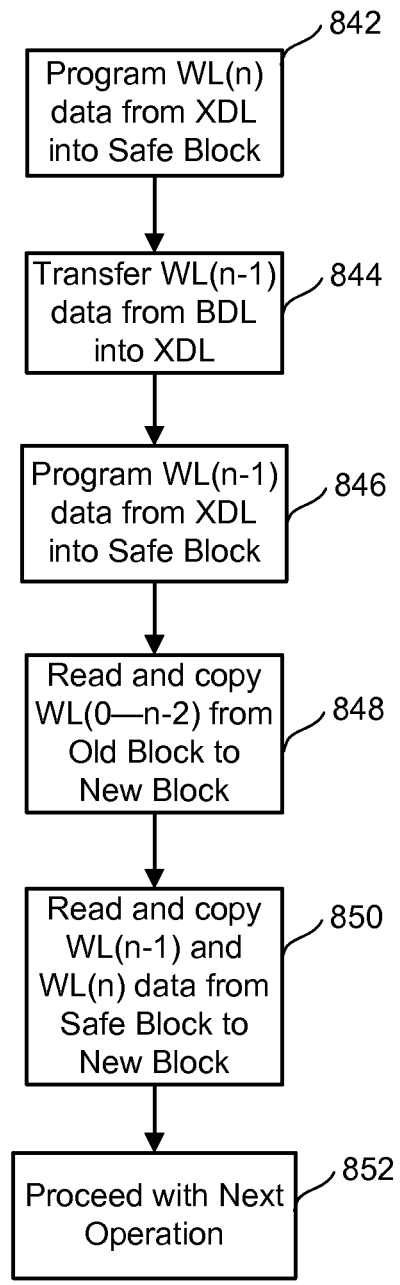
FIG. 18A is a flow chart describing a process of transferring data from a faulty block into a new block using latches

FIG. 18A is a flow chart describing a process of transferring data from a faulty block into a new block using latches XDL, ADL, and BDL. The process of FIG. 18A is one example implementation step 836 of FIG. 18. Using the earlier convention, since the system has discovered a programming error on the Old Block, all of the data currently programmed on the Old Block, namely WL(0) through WL(n−2), along with the data currently held in latches XDL (intended for WL(n)) and BDL (intended for WL(n−1)), must be transferred to the New Block.

In step 842, the system programs the data held in XDL (the data intended for WL(n) in the Old Block) into a word line in the Safe Block. In step 844, the system transfers the data held in BDL (the data retrieved from WL(n−1)) into XDL. In step 846, the system programs the data now in XDL into another word line in the Safe Block. In step 848, the system reads and copies WL(0) through WL(n−2) from the Old Block into corresponding locations (and in the same order) in the New Block. In some embodiments, when reprogramming this data to the New Block, the system uses the processes of FIGS. 11 and 12 to program data as depicted in FIG. 7. The system can also employ the processes of FIG. 14, 16, or 18 to ensure that if the New Block is found to be faulty, the data can still be saved to another location.

In step 850, the system reads and copies the data saved in the Safe Block (i.e. the uncorrupted copies of WL(n−1) and WL(n) in the Old Block) into corresponding locations in the New Block. In step 852, the system proceeds to the next operation.

Figure 19:
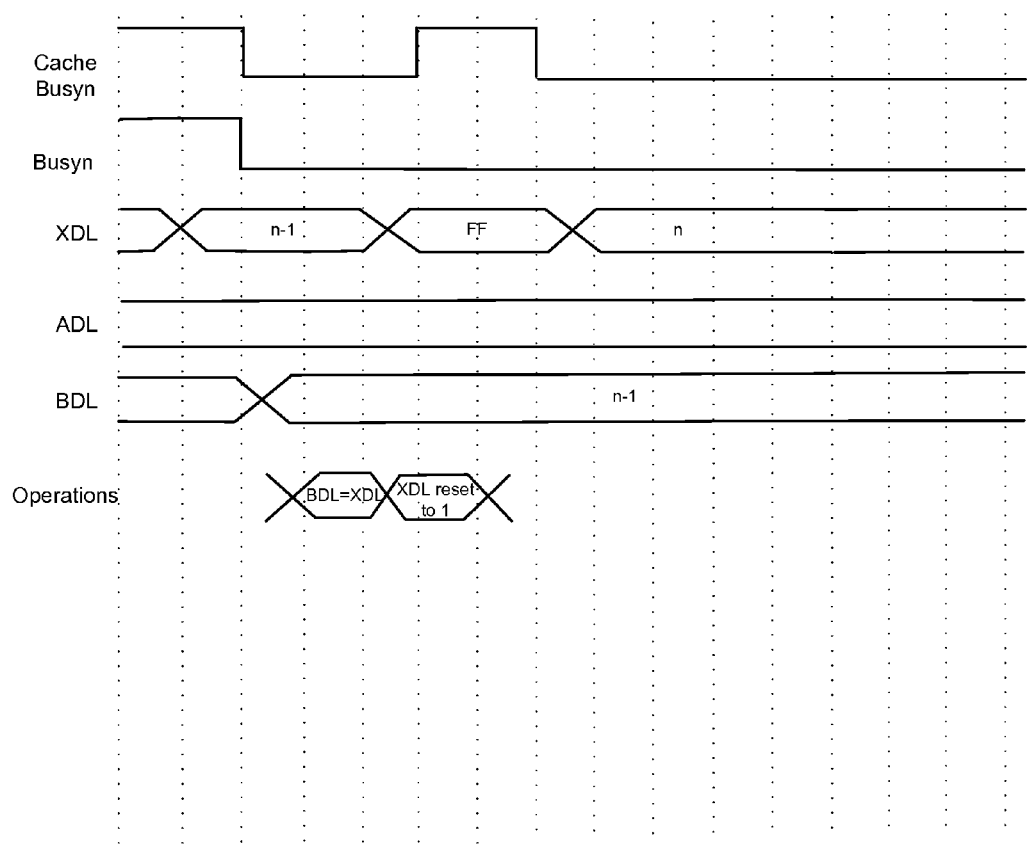
FIG. 19 depicts a timing diagram describing the data transfers occurring during the process of FIG. 18.

FIG. 19 is a timing diagram depicting the process of FIG. 18 (up to step 834). The various signals depicted in FIG. 19 are the same signals depicted in FIGS. 15 and 17. Unlike the timing diagrams of FIGS. 15 and 17, in the timing diagram of FIG. 19, signal CacheBusyn is only busy for two periods, namely during the execution of steps 822 and 828 of FIG. 18, during which XDL is loaded with the data to be programmed into WL(n−1) and WL(n), respectively.

The first data stored in XDL is the data read from WL(n−1) (shown by the portion of signal XDL labeled "n−1"), which corresponds to step 822 of FIG. 18. Soon after the data read from WL(n−1) is loaded into XDL, the system flushes the data held in BDL in accordance with step 824 of FIG. 18 (not shown), and loads then loads the data held in XDL into BDL (as shown by the region of signal BDL labeled "n−1", corresponding to step 826 of FIG. 18. After the data is transferred from XDL to BDL, XDL is reset, indicated by the region of signal XDL labeled "FF".

Once XDL has been reset, the system loads the data to be programmed into WL(n) into XDL (indicated by the region of signal XDL labeled "n"). The loading of the data to be programmed into WL(n) into XDL corresponds to step 828 of FIG. 18. Once the data to be programmed into WL(n) has been loaded into XDL, the system programs WL(n) with the data contained in XDL (not shown).

The signal labeled "Operations" indicates the state transitions of the latches. In step 826 of FIG. 18, when the system transfers the data (which was read from WL(n−1)) from XDL to BDL, Operations is labeled "BDL=XDL". Once the transfer of data has completed, XDL is reset, indicated when Operations is labeled "XDL reset to 1."

The foregoing specification describes a system and methods for programming non-volatile memory elements by using latches to transfer data, and, upon discovering errors in previously programmed non-volatile memory elements, recovering the corresponding data from the latches and programming the recovered data to new non-volatile memory elements.

One embodiment comprises a method for programming a non-volatile memory system, the non-volatile memory system includes a first set of word lines, the first set of word lines include a first word line, a second word line and a third word line, the non-volatile memory system capable of storing first data, second data and third data, the method comprising: loading the second data into a first latch for the non-volatile memory system; storing the first data in a third latch for the non-volatile memory system, the first data has already been programmed into a plurality of non-volatile storage elements connected to the first word line; moving the second data from the first latch to a second latch for the non-volatile memory system; programming the second data from the first latch into a plurality of non-volatile storage elements connected to the second word line; loading the third data into the first latch for programming the third data into a plurality of non-volatile storage elements connected to the third word line; determining whether the second data is correctly stored in the non-volatile storage elements connected to the second word line; and if the second data is not correctly stored in the non-volatile storage elements connected to the second word line, then: accessing the first data from the third latch and programming the accessed first data into non-volatile storage elements connected one or more word lines of a second set of word lines that are different than the first set of word lines, accessing the second data from the second latch and programming the accessed second data into non-volatile storage elements connected one or more word lines of the second set of word lines, and accessing the third data from the first latch and programming the access third data into non-volatile storage elements connected one or more word lines of the second set of word lines. The use of first, second and third does not necessarily mean the position in the physical world. For example, the first, second and third word lines are three word lines that do not necessarily need to be the first three word lines of the block. Rather, the use of first, second and third is intended to identify three different word lines.

One example implementation further includes commencing programming of the third data from the first latch into the non-volatile storage elements connected to the third word line prior to the determining whether the second data is correctly stored in the non-volatile storage elements connected to the second word line. Another example implementation further includes completing programming of the third data from the first latch into the non-volatile storage elements connected to the third word line prior to the determining whether the second data is correctly stored in the non-volatile storage elements connected to the second word line.

One embodiment comprises a method for programming a non-volatile memory system, the non-volatile memory system includes a first set of word lines, the first set of word lines include a first word line, a second word line and a third word line, the non-volatile memory system capable of storing first data, second data and third data, the method comprising: loading the first data into a set of latches for the first set of word lines; programming the first data from the set of latches into non-volatile storage elements connected to the first word line; loading the second data into the set of latches; programming the second data from the set of latches into non-volatile storage elements connected to the second word line; loading the third data into the set of latches for purposes of programming the third data into non-volatile storage elements connected to the third word line; determining whether the second data is correctly stored in the plurality of non-volatile storage elements connected to the second word line while the first data, the second data and the third data are stored in the set of latches; and if the second data is not correctly stored in the non-volatile storage elements connected to the second word line, then accessing the first data, the second data and the third data from the set of latches and programming the accessed first data, the accessed second data and the accessed third data into non-volatile storage elements connected a second set of word lines that are different than the first set of word lines.

One embodiment comprises a non-volatile storage system, the non-volatile storage system capable of storing first data, second data and third data, the non-volatile storage system comprising: a plurality of non-volatile storage elements; multiple sets of word lines connected to the non-volatile storage elements, the sets of word lines include a first set of word lines, the first set of word lines includes a first word line, a second word line and a third word line; bit lines connected to the non-volatile storage elements; a set of latches connected to the bit lines; and one or more managing circuits in communication with the sets of word lines and the set of latches, the one or more managing circuits load the first data into the set of latches, the one or more managing circuits program the first data from the set of latches into non-volatile storage elements connected to the first word line, the one or more managing circuits load the second data into the set of latches and program the second data from the set of latches into non-volatile storage elements connected to the second word line, the one or more managing circuits load the third data into the set of latches for purposes of programming the third data into non-volatile storage elements connected to the third word line, the one or more managing circuits determine whether the second data is correctly stored in the plurality of non-volatile storage elements connected to the second word line while the first data and the second data and the third data are stored in the set of latches, if the second data is not correctly stored in the plurality of non-volatile storage elements connected to the second word line then the one or more managing circuits access the first data, the second data and the third data from the set of latches and program the accessed first data, the second data and the third data into non-volatile storage elements connected a second set of word lines that are different than the first set of word lines.

The foregoing detailed description of the invention has been presented for purposes of illustration and description. It is not intended to be exhaustive or to limit the invention to the precise form disclosed. Many modifications and variations are possible in light of the above teaching. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

One embodiment includes a method for programming a non-volatile memory system, the non-volatile memory system includes a first set of word lines, the first set of word lines include a first word line, a second word line and a third word line, the non-volatile memory system capable of storing first data, second data and third data, the method comprising: loading the second data into a first latch for the non-volatile memory system; storing the first data in a third latch for the non-volatile memory system, the first data has already been programmed into a plurality of non-volatile storage elements connected to the first word line; moving the second data from the first latch to a second latch for the non-volatile memory system; programming the second data from into a plurality of non-volatile storage elements connected to the second word line; loading the third data into the first latch for programming the third data into a plurality of non-volatile storage elements connected to the third word line; determining whether the second data is correctly stored in the non-volatile storage elements connected to the second word line; and if the second data is not correctly stored in the non-volatile storage elements connected to the second word line, then: accessing the first data from the third latch and programming the accessed first data into non-volatile storage elements connected one or more word lines of a second set of word lines that are different than the first set of word lines, accessing the second data from the second latch and programming the accessed second data into non-volatile storage elements connected one or more word lines of the second set of word lines, and accessing the third data from the first latch and programming the access third data into non-volatile storage elements connected one or more word lines of the second set of word lines.

In one embodiment, the storing the first data in the third latch comprises moving the first data from the second latch to the third latch prior to moving the second data from the first latch to the second latch. One embodiment further comprises loading the first data into the first latch; programming the first data from the first latch into the non-volatile storage elements connected to the first word line; and moving the first data from the first latch to the second latch prior to loading the second data into the first latch.

One embodiment further comprises reading the first data from the non-volatile storage elements connected to the first word line and loading the first data read from the non-volatile storage elements connected to the first word line into the first latch.

One embodiment further comprises reading the first data from the non-volatile storage elements connected to the first word line, the storing the first data in the third latch comprises loading the first data read from the non-volatile storage elements connected to the first word line into the third latch.

One embodiment further comprises commencing programming of the third data from the second latch into the non-volatile storage elements connected to the third word line after determining that the second data is correctly stored in the non-volatile storage elements connected to the second word line.

One embodiment further comprises completing programming of the second data from the second latch into the non-volatile storage elements connected to the second word line after loading the third data into the first latch.

In one embodiment, the first set of word lines comprise a first block, the method further comprises: reading the first data from the non-volatile storage elements connected to the first word line, combining the first data with data from two other blocks and storing the combined data as three bits per memory cell in a set of non-volatile storage elements connected to a word line in a fourth block; reading the second data from the non-volatile storage elements connected to the second word line, combining the second data with data from two other blocks and storing the combined data as three bits per memory cell in a different set of non-volatile storage elements connected to a word line in the fourth block; and reading the third data from the non-volatile storage elements connected to the third word line, combining the third data with data from two other blocks and storing the combined data as three bits per memory cell in a another set of non-volatile storage elements connected to a word line in the fourth block.

In one embodiment, the non-volatile storage elements connected to the first word line, the non-volatile storage elements connected to the second word line and the non-volatile storage elements connected to the third word line are single programming level NAND flash memory cells.

In one embodiment, the first latch, the second latch and the third latch are connected to bit lines for the non-volatile storage elements connected to the first word line, the nonvolatile storage elements connected to the second word line and the non-volatile storage elements connected to the third word line.

One embodiment includes a method for programming a non-volatile memory system, the non-volatile memory system includes a first set of word lines, the first set of word lines include a first word line, a second word line and a third word line, the non-volatile memory system capable of storing first data, second data and third data, the method comprising: loading the first data into a set of latches for the first set of word lines; programming the first data from the set of latches into non-volatile storage elements connected to the first word line; loading the second data into the set of latches; programming the second data from the set of latches into non-volatile storage elements connected to the second word line; loading the third data into the set of latches for purposes of programming the third data into non-volatile storage elements connected to the third word line; determining whether the second data is correctly stored in the plurality of non-volatile storage elements connected to the second word line while the first data, the second data and the third data are stored in the set of latches; and if the second data is not correctly stored in the non-volatile storage elements connected to the second word line, then accessing the first data, the second data and the third data from the set of latches and programming the accessed first data, the accessed second data and the accessed third data into non-volatile storage elements connected a second set of word lines that are different than the first set of word lines.

In one embodiment, the latches are connected to bit lines for the non-volatile storage elements connected to the first word line, the non-volatile storage elements connected to the second word line and the non-volatile storage elements connected to the third word line.

In one embodiment, the first set of latches comprises a first latch, a second latch and a third latch; the loading the first data into the set of latches comprises loading the first data into the first latch; the loading of the second data into the set of latches comprises loading the second data into the first latch; the loading of the third data into the set of latches comprises loading the third data into the first latch, the determining whether the second data is correctly stored is performed while the third data is in the first latch; the programming the first data comprises programming the first data from the second latch; the programming the second data comprises programming the second data from the first second latch; and the method further comprises moving the first data from the first latch to the second latch prior to programming the second data, moving the first data from the second latch to the third latch after programming the second data, and moving the second data from the first latch to the second latch after programming the second data and prior to the determining whether the second data is correctly stored.

In one embodiment, the first set of latches comprises a first latch, a second latch and a third latch; the loading the second data into the set of latches comprises loading the second data into the first latch; the loading the first data into the set of latches comprises reading the first data from the non-volatile storage elements connected to the first word line and loading the first data read from the non-volatile storage elements connected to the first word line into the second latch; the loading of the third data into the set of latches comprises loading the third data into the first latch, the determining whether the second data is correctly stored is performed while the third data is in the first latch; the programming the second data comprises programming the second data from the first latch while the first data is in the second latch; and the method further comprises moving the first data from the second latch to the third latch after programming the second data and moving the second data from the first latch to the second latch after programming the second data and prior to the determining whether the second data is correctly stored.

In one embodiment, the first set of latches comprises a first latch, a second latch and a third latch; the loading the second data into the set of latches comprises loading the second data into the first latch; the loading the first data into the set of latches comprises reading the first data from the non-volatile storage elements connected to the first word line and loading the first data read from the non-volatile storage elements connected to the first word line into the third latch; the loading of the third data into the set of latches comprises loading the third data into the first latch, the determining whether the second data is correctly stored is performed while the third data is in the first latch; the programming the second data comprises programming the second data from the first latch while the first data is in the third latch; and the method further comprises moving the second data from the first latch to the second latch after programming the second data and prior to loading the third data into the third latch.

One embodiment includes a non-volatile storage system, the non-volatile storage system capable of storing first data, second data and third data, the non-volatile storage system comprising: a plurality of non-volatile storage elements; multiple sets of word lines connected to the non-volatile storage elements, the sets of word lines include a first set of word lines, the first set of word lines includes a first word line, a second word line and a third word line; bit lines connected to the non-volatile storage elements; a set of latches connected to the bit lines; and one or more managing circuits in communication with the sets of word lines and the set of latches, the one or more managing circuits load the first data into the set of latches, the one or more managing circuits program the first data from the set of latches into non-volatile storage elements connected to the first word line, the one or more managing circuits load the second data into the set of latches and program the second data from the set of latches into non-volatile storage elements connected to the second word line, the one or more managing circuits load the third data into the set of latches for purposes of programming the third data into non-volatile storage elements connected to the third word line, the one or more managing circuits determine whether the second data is correctly stored in the plurality of non-volatile storage elements connected to the second word line while the first data and the second data and the third data are stored in the set of latches, if the second data is not correctly stored in the plurality of non-volatile storage elements connected to the second word line then the one or more managing circuits access the first data, the second data and the third data from the set of latches and program the accessed first data, the second data and the third data into non-volatile storage elements connected a second set of word lines that are different than the first set of word lines.

In one embodiment, the non-volatile storage elements, multiple sets of word lines, the bit lines and the latches comprise a memory circuit; the one or more managing circuits comprise a managing circuit that is part of the memory circuit; the one or more managing circuits further comprise a controller that is a separate circuit from and in communication with the memory circuit; the controller issues a command to the memory circuit to program the first data from the set of latches into non-volatile storage elements connected to the first word line; the controller issues a command to the memory circuit to load the second data into the set of latches and program the second data from the set of latches into non-volatile storage elements connected to the second word line; the controller issues a command to the memory circuit to load the third data into the set of latches for purposes of programming the third data into non-volatile storage elements connected to the third word line; the controller issues a command to the memory circuit to determine whether the second data is correctly stored in the plurality of non-volatile storage elements connected to the second word line; and if the second data is not correctly stored in the plurality of non-volatile storage elements connected to the second word line then the controller issues one or more commands to the memory circuit to program the accessed first data, the second data and the third data into non-volatile storage elements connected the second set of word lines that are different than the first set of word lines.

In one embodiment, the first set of latches comprises a first latch, a second latch and a third latch; the one or more managing circuits load the first data into the set of latches by loading the first data into the first latch; the one or more managing circuits load the second data into the set of latches by loading the second data into the first latch; the one or more managing circuits load the third data into the set of latches by loading the third data into the first latch, the one or more managing circuits determine whether the second data is correctly stored while the third data is in the first latch; the one or more managing circuits program the first data from the second latch; the one or more managing circuits program the second data from the first second latch; and the one or more managing circuits move the first data from the first latch to the second latch prior to programming the second data, move the first data from the second latch to the third latch prior to programming the second data, and move the second data from the first latch to the second latch prior to programming the second data and prior to the determining whether the second data is correctly stored.

In one embodiment, the first set of latches comprises a first latch, a second latch and a third latch; the one or more managing circuits load the second data into the set of latches by loading the second data from the non-volatile storage elements connected to the second word line into the first latch; the one or more managing circuits move the second data from the first latch to the second latch; the one or more managing circuits load the third data into the set of latches by loading the third data into the first latch, the one or more managing circuits determine whether the second data is correctly stored while the third data is in the first latch; and the one or more managing circuits program the second data from the second latch while the third data is in the first latch.

In one embodiment, the first set of latches comprises a first latch, a second latch and a third latch; the one or more managing circuits load the second data into the set of latches by loading the second data from the non-volatile storage elements connected to the second word line into the first latch; the one or more managing circuits move the second data from the first latch to the second latch; the one or more managing circuits move the second data from the first latch to the third latch; the one or more managing circuits load the third data into the set of latches by loading the third data into the first latch; and the one or more managing circuits program the first data by programming the first data from the first latch while the second data is in the third latch.

What is claimed is:

1. A non-volatile storage system, the non-volatile storage system capable of storing first data, second data and third data, the non-volatile storage system comprising:
a plurality of non-volatile storage elements;
multiple sets of word lines connected to the non-volatile storage elements, the sets of word lines include a first set of word lines, the first set of word lines includes a first word line, a second word line and a third word line;
bit lines connected to the non-volatile storage elements;
a set of latches connected to the bit lines; and
one or more managing circuits in communication with the sets of word lines and the set of latches, the one or more managing circuits load the first data into the set of latches, the one or more managing circuits program the first data from the set of latches into non-volatile storage elements connected to the first word line, the one or more managing circuits load the second data into the set of latches and program the second data from the set of latches into non-volatile storage elements connected to the second word line, the one or more managing circuits load the third data into the set of latches for purposes of programming the third data into non-volatile storage elements connected to the third word line, the one or more managing circuits determine whether the second data is correctly stored in the plurality of non-volatile storage elements connected to the second word line while the first data and the second data and the third data are stored in the set of latches, if the second data is not correctly stored in the plurality of non-volatile storage elements connected to the second word line then the one or more managing circuits access the first data, the second data and the third data from the set of latches and program the accessed first data, the second data and the third data into non-volatile storage elements connected a second set of word lines that are different than the first set of word lines.

2. The non-volatile storage system of claim 1, wherein:
the non-volatile storage elements, multiple sets of word lines, the bit lines and the latches comprise a memory circuit;
the one or more managing circuits comprise a managing circuit that is part of the memory circuit;
the one or more managing circuits further comprise a controller that is a separate circuit from and in communication with the memory circuit;
the controller issues a command to the memory circuit to program the first data from the set of latches into non-volatile storage elements connected to the first word line;
the controller issues a command to the memory circuit to load the second data into the set of latches and program the second data from the set of latches into non-volatile storage elements connected to the second word line;
the controller issues a command to the memory circuit to load the third data into the set of latches for purposes of programming the third data into non-volatile storage elements connected to the third word line;
the controller issues a command to the memory circuit to determine whether the second data is correctly stored in the plurality of non-volatile storage elements connected to the second word line; and
if the second data is not correctly stored in the plurality of non-volatile storage elements connected to the second word line then the controller issues one or more commands to the memory circuit to program the accessed first data, the second data and the third data into non-volatile storage elements connected the second set of word lines that are different than the first set of word lines.

3. The non-volatile storage system of claim 1, wherein:
the first set of latches comprises a first latch, a second latch and a third latch;

the one or more managing circuits load the first data into the set of latches by loading the first data into the first latch;

the one or more managing circuits load the second data into the set of latches by loading the second data into the first latch;

the one or more managing circuits load the third data into the set of latches by loading the third data into the first latch, the one or more managing circuits determine whether the second data is correctly stored while the third data is in the first latch;

the one or more managing circuits program the first data from the second latch;

the one or more managing circuits program the second data from the first second latch; and the one or more managing circuits move the first data from the first latch to the second latch prior to programming the second data, move the first data from the second latch to the third latch prior to programming the second data, and move the second data from the first latch to the second latch prior to programming the second data and prior to the determining whether the second data is correctly stored.

4. The non-volatile storage system of claim 1, wherein:

the first set of latches comprises a first latch, a second latch and a third latch;

the one or more managing circuits load the second data into the set of latches by loading the second data from the non-volatile storage elements connected to the second word line into the first latch;

the one or more managing circuits move the second data from the first latch to the second latch;

the one or more managing circuits load the third data into the set of latches by loading the third data into the first latch, the one or more managing circuits determine whether the second data is correctly stored while the third data is in the first latch; and the one or more managing circuits program the second data from the second latch while the third data is in the first latch.

5. The non-volatile storage system of claim 1, wherein:

the first set of latches comprises a first latch, a second latch and a third latch;

the one or more managing circuits load the second data into the set of latches by loading the second data from the non-volatile storage elements connected to the second word line into the first latch;

the one or more managing circuits move the second data from the first latch to the second latch;

the one or more managing circuits move the second data from the first latch to the third latch;

the one or more managing circuits load the third data into the set of latches by loading the third data into the first latch; and the one or more managing circuits program the first data by programming the first data from the first latch while the second data is in the third latch.

6. A method for programming a non-volatile memory system, the non-volatile memory system includes a first set of word lines, the first set of word lines include a first word line, a second word line and a third word line, the non-volatile memory system capable of storing first data, second data and third data, the method comprising:

loading the second data into a first latch for the non-volatile memory system;

storing the first data in a third latch for the non-volatile memory system, the first data has already been programmed into a plurality of non-volatile storage elements connected to the first word line;

moving the second data from the first latch to a second latch for the non-volatile memory system;

programming the second data from into a plurality of non-volatile storage elements connected to the second word line;

loading the third data into the first latch for programming the third data into a plurality of non-volatile storage elements connected to the third word line;

determining whether the second data is correctly stored in the non-volatile storage elements connected to the second word line; and if the second data is not correctly stored in the non-volatile storage elements connected to the second word line, then:

accessing the first data from the third latch and programming the accessed first data into non-volatile storage elements connected one or more word lines of a second set of word lines that are different than the first set of word lines, accessing the second data from the second latch and programming the accessed second data into non-volatile storage elements connected one or more word lines of the second set of word lines, and accessing the third data from the first latch and programming the access third data into non-volatile storage elements connected one or more word lines of the second set of word lines.

7. The method of claim 6, wherein:

the storing the first data in the third latch comprises moving the first data from the second latch to the third latch prior to moving the second data from the first latch to the second latch.

8. The method of claim 7, further comprising:

loading the first data into the first latch;

programming the first data from the first latch into the non-volatile storage elements connected to the first word line; and moving the first data from the first latch to the second latch prior to loading the second data into the first latch.

9. The method of claim 7, further comprising:

reading the first data from the non-volatile storage elements connected to the first word line and loading the first data read from the non-volatile storage elements connected to the first word line into the first latch.

10. The method of claim 6, further comprising:

reading the first data from the non-volatile storage elements connected to the first word line, the storing the first data in the third latch comprises loading the first data read from the non-volatile storage elements connected to the first word line into the third latch.

11. The method of claim 6, further comprising:

commencing programming of the third data from the second latch into the non-volatile storage elements connected to the third word line after determining that the second data is correctly stored in the non-volatile storage elements connected to the second word line.

12. The method of claim 6, further comprising:

completing programming of the second data from the second latch into the non-volatile storage elements connected to the second word line after loading the third data into the first latch.

13. The method of claim 6, wherein the first set of word lines comprise a first block, the method further comprises:

reading the first data from the non-volatile storage elements connected to the first word line, combining the first data with data from two other blocks and storing the combined data as three bits per memory cell in a set of non-volatile storage elements connected to a word line in a fourth block;

reading the second data from the non-volatile storage elements connected to the second word line, combining the second data with data from two other blocks and storing the combined data as three bits per memory cell in a different set of non-volatile storage elements connected to a word line in the fourth block; and reading the third data from the non-volatile storage elements connected to the third word line, combining the third data with data from two other blocks and storing the combined data as three bits per memory cell in a another set of non-volatile storage elements connected to a word line in the fourth block.

14. The method of claim 6, wherein:
the non-volatile storage elements connected to the first word line, the non-volatile storage elements connected to the second word line and the non-volatile storage elements connected to the third word line are single programming level NAND flash memory cells.

15. The method of claim 6, wherein:
the first latch, the second latch and the third latch are connected to bit lines for the non-volatile storage elements connected to the first word line, the non-volatile storage elements connected to the second word line and the non-volatile storage elements connected to the third word line.

16. A method for programming a non-volatile memory system, the non-volatile memory system includes a first set of word lines, the first set of word lines include a first word line, a second word line and a third word line, the non-volatile memory system capable of storing first data, second data and third data, the method comprising:

loading the first data into a set of latches for the first set of word lines;

programming the first data from the set of latches into non-volatile storage elements connected to the first word line;

loading the second data into the set of latches;

programming the second data from the set of latches into non-volatile storage elements connected to the second word line;

loading the third data into the set of latches for purposes of programming the third data into non-volatile storage elements connected to the third word line;

determining whether the second data is correctly stored in the plurality of non-volatile storage elements connected to the second word line while the first data, the second data and the third data are stored in the set of latches; and if the second data is not correctly stored in the non-volatile storage elements connected to the second word line, then accessing the first data, the second data and the third data from the set of latches and programming the accessed first data, the accessed second data and the accessed third data into non-volatile storage elements connected a second set of word lines that are different than the first set of word lines.

17. The method of claim 16, wherein:
the latches are connected to bit lines for the non-volatile storage elements connected to the first word line, the non-volatile storage elements connected to the second word line and the non-volatile storage elements connected to the third word line.

18. The method of claim 16, wherein:
the first set of latches comprises a first latch, a second latch and a third latch;
the loading the first data into the set of latches comprises loading the first data into the first latch;
the loading of the second data into the set of latches comprises loading the second data into the first latch;
the loading of the third data into the set of latches comprises loading the third data into the first latch, the determining whether the second data is correctly stored is performed while the third data is in the first latch;
the programming the first data comprises programming the first data from the second latch;
the programming the second data comprises programming the second data from the first second latch; and
the method further comprises moving the first data from the first latch to the second latch prior to programming the second data, moving the first data from the second latch to the third latch after programming the second data, and moving the second data from the first latch to the second latch after programming the second data and prior to the determining whether the second data is correctly stored.

19. The method of claim 16, wherein:
the first set of latches comprises a first latch, a second latch and a third latch;
the loading the second data into the set of latches comprises loading the second data into the first latch;
the loading the first data into the set of latches comprises reading the first data from the non-volatile storage elements connected to the first word line and loading the first data read from the non-volatile storage elements connected to the first word line into the second latch;
the loading of the third data into the set of latches comprises loading the third data into the first latch, the determining whether the second data is correctly stored is performed while the third data is in the first latch;
the programming the second data comprises programming the second data from the first latch while the first data is in the second latch; and
the method further comprises moving the first data from the second latch to the third latch after programming the second data and moving the second data from the first latch to the second latch after programming the second data and prior to the determining whether the second data is correctly stored.

20. The method of claim 16, wherein:
the first set of latches comprises a first latch, a second latch and a third latch;
the loading the second data into the set of latches comprises loading the second data into the first latch;
the loading the first data into the set of latches comprises reading the first data from the non-volatile storage elements connected to the first word line and loading the first data read from the non-volatile storage elements connected to the first word line into the third latch;
the loading of the third data into the set of latches comprises loading the third data into the first latch, the determining whether the second data is correctly stored is performed while the third data is in the first latch;
the programming the second data comprises programming the second data from the first latch while the first data is in the third latch; and
the method further comprises moving the second data from the first latch to the second latch after programming the second data and prior to loading the third data into the third latch.

* * * * *